US008877077B2

(12) United States Patent
Lichtensteiger

(10) Patent No.: US 8,877,077 B2
(45) Date of Patent: Nov. 4, 2014

(54) METHOD FOR PRODUCING THIN, FREE-STANDING LAYERS OF SOLID STATE MATERIALS WITH STRUCTURED SURFACES

(75) Inventor: Lukas Lichtensteiger, Zurich (CH)

(73) Assignee: Siltectra GmbH (DE)

( * ) Notice: Subject to any disclaimer, the term of this patent is extended or adjusted under 35 U.S.C. 154(b) by 68 days.

(21) Appl. No.: 13/141,821

(22) PCT Filed: Dec. 18, 2009

(86) PCT No.: PCT/EP2009/067539
§ 371 (c)(1),
(2), (4) Date: Jul. 8, 2011

(87) PCT Pub. No.: WO2010/072675
PCT Pub. Date: Jul. 1, 2010

(65) Prior Publication Data
US 2011/0259936 A1    Oct. 27, 2011

Related U.S. Application Data

(60) Provisional application No. 61/140,466, filed on Dec. 23, 2008, provisional application No. 61/175,447, filed on May 4, 2009, provisional application No. 61/176,105, filed on May 6, 2009.

(51) Int. Cl.
*B44C 1/22*    (2006.01)

(52) U.S. Cl.
USPC ............... 216/54; 216/83; 438/68; 438/459; 438/689; 438/745; 117/915; 225/1

(58) Field of Classification Search
None
See application file for complete search history.

(56) References Cited

U.S. PATENT DOCUMENTS 4,582,559 A * 4/1986 Tanielian et al. ........ 204/192.25
2007/0249140 A1* 10/2007 Dross et al. ................. 438/458

OTHER PUBLICATIONS

Z. Suo et al., International Journal of Solids Structures, vol. 25, year 1989, pp. 1337-1353.*
F. Dross et al. Proceedings of 23rd European Photovoltaic Solar Energy Conference and Exhibition, 2008, p. 1278-1281.*
R. Feng and R.J. Farris, "Influence of Processing Conditions on the Thermal and Mechanical Properties of SU8 Negative Photoresist Coatings", J. Micromech. Microeng. vol. 13, year 2003, pp. 80-88.*
International Search Report dated Feb. 28, 2011, Application No. PCT/EP2009/067539, 1 Page.
International Preliminary Report on Patentability dated Jul. 7, 2011, Application No. PCT/EP2009/067539, Applicant SILTECTRA GmbH et al., 6 Pages.
F. Dross et al. "Stress-induced large-area lift-off of crystalline Si films", Applied Physics A; Materials Science & Processing, Springer, Berlin, DE, vol. 89, No. 1, Jul. 5, 2007, pp. 149-152.

* cited by examiner

*Primary Examiner* — Lan Vinh
*Assistant Examiner* — Jiong-Ping Lu
(74) *Attorney, Agent, or Firm* — Brooks Kushman P.C.

(57) ABSTRACT

A method of printing comprises the steps of: providing a solid state material having an exposed surface; applying an auxiliary layer to the exposed surface to form a composite structure, the auxiliary layer having a stress pattern; subjecting the composite structure to conditions facilitating fracture of the solid state material along a plane at a depth therein; and removing the auxiliary layer and, therewith, a layer of the solid state material terminating at the fracture depth, wherein an exposed surface of the removed layer of solid state material has a surface topology corresponding to the stress pattern.

28 Claims, 3 Drawing Sheets

METHOD FOR PRODUCING THIN, FREE-STANDING LAYERS OF SOLID STATE MATERIALS WITH STRUCTURED SURFACES

CROSS-REFERENCE TO RELATED APPLICATIONS

This application is a U.S. national phase of PCT Application No. PCT/EP2009/067539 filed Dec. 18, 2009 which claims the benefit of U.S. provisional Application Nos. 61/140,466, filed Dec. 23, 2008; 61/175,447, filed May 4, 2009; and 61/176,105, filed May 6, 2009, respectively, the disclosures of which are incorporated in their entirety by reference herein.

FIELD OF THE INVENTION

The present invention relates to the production of solid state material layers, and in particular, to techniques for producing relatively thin, free-standing layers of solid state materials such as microelectronic materials. The present invention also relates to techniques for creating geometrical structures on the surfaces of such layers.

DESCRIPTION OF RELATED ART

Fabrication of microelectronic devices typically includes two distinct groups of processing steps: first, a relatively thin free-standing layer is cut from a larger block of solid state material (e.g., a semiconducting material such as silicon), and second, a variety of further processing steps and techniques are used to form structures on this free-standing layer, in particular on its surface. Often, these surface structures do not involve any additional materials but rather are created purely by shaping the material at the surface of the free-standing layer, e.g., by etching.

As an example, in the first group of processing steps, a thin wafer may be cut from a monocrystalline silicon ingot (e.g., using a wiresaw). The wafer surface is then further processed (e.g., by polishing) to obtain a smooth surface. In a second group of processing steps, geometric structures such as trenches, pyramids, mesas, needles, etc. are then formed on the surface of the wafer. This is achieved through a (usually complicated and expensive) sequence of steps, such as deposition of a mask, mask patterning (e.g., by photolithography), patterning of the underlying wafer surface, such as by dry (e.g., RIE) or wet anisotropic (e.g., KOH) or isotropic (e.g., HF-based) etching, and finally removal of the mask. Structures formed on the surface of a wafer may be used, e.g., to improve the light-to-electricity conversion efficiency of solar cells—for example, by creating random inverted pyramid structures on the wafer surface, which enhances light dispersion into the active area of the solar cell. In this simple case a mask may not be required, and a single etching step (e.g., by NaOH wet etch) may be sufficient. In a more complex example, structures such as "photonic crystals" may be created on the wafer surface, facilitating modification of the electro-optic characteristics of the wafer material (in particular, the bandgap). Since it is necessary to control the local arrangement of structures precisely in such applications, the techniques are typically much more involved in terms of processing requirements (e.g., high-quality mask and RIE etching) and thus very expensive. Other applications include micro-electromechanical systems, where creating structures (e.g., trenches, mesas) on the surface of a wafer often represents an early step (or steps) in the production of complicated three-dimensional devices such as sensors and actuators.

One general disadvantage of current methods for producing thin, free-standing layers of solid state materials with structured surfaces is the large number of processing steps they typically require, both for producing the free-standing layer itself, and then subsequently for structuring its surface. This makes such techniques expensive and slow, particularly where the local arrangement of the surface structures must be controlled, mandating the use of a mask and lithographic processing. An additional problem is the consumption of solid state material: for example, when cutting thin wafers from an ingot using wiresaws, about 50% of the ingot material is lost as so called "kerf loss" (saw dust, etc.). Further material is lost when polishing the wafers, and also subsequently in the structure-formation steps such as etching. Since the solid state material is often expensive, this adds significantly to the production costs. Furthermore, although for most applications a very thin layer of solid state material is sufficient (and indeed often more favorable in terms of, e.g., electronic or optical properties) to produce the desired devices, most current approaches cannot economically manufacture such, thin free-standing layers of solid state material.

Recently, methods for producing thin free-standing layers of solid state material with minimal kerf loss have been described. However, there remains a need to create locally definable structures on the surface of such thin, free-standing layers in a controllable way that is simpler and more economical than current methods.

BRIEF SUMMARY OF THE INVENTION

In accordance with embodiments of the present invention, the production of thin, free-standing layers of solid state materials with structured surfaces is improved by combining production of the layers with the previously separate production of surface structures. Embodiments of the invention provide a single, simple, and inexpensive process that circumvents most of the above-identified disadvantages. Embodiments of the invention can produce thin, free-standing layers of solid state materials with locally controllable thickness and locally definable patterns of surface structures.

In various embodiments, thin, free-standing layers of solid state materials with locally controllable patterns of surface structures are produced by inducing locally controllable three-dimensional stress patterns in the solid state material. For example, locally controlled stresses may be set up in an auxiliary layer that adheres to the solid state material. The auxiliary layer may be joined to a work piece of solid state material through sufficiently strong adhesion. The auxiliary layer is prepared in a way that allows locally defined stresses of different magnitudes to be induced at desired locations in this layer. This also induces locally defined stresses in the adhering work piece For example, the auxiliary layer may consist of a pattern of areas some with a relatively high coefficient of thermal expansion (CTE) and some (or the remainder) with a relatively low CTE. If the auxiliary layer is adhered to a work piece whose CTE is closer to the "low CTE" than to the "high CTE" of the auxiliary layer, and if the composite structure (auxiliary layer—work piece) is subjected to a temperature change, then in those areas of the auxiliary layer that have high CTE larger stresses will be induced than in those areas with lower CTE. Also, this will induce directly related, locally defined stress patterns in the adhering work piece of solid state material.

For example, the auxiliary layer may comprise a polymer characterized by a CTE (the "high CTE") that is greater than about 50*10−6 K−1 at room temperature. Preferably, the polymer is characterized by a CTE that is greater than about 100*10−6 K−1 at room temperature, and more preferably, the polymer is characterized by a CTE that is greater than about 200*10−6 K−1 at room temperature. The polymer may be patterned with "void" areas, i.e., areas where the polymer material is locally removed. If the material is removed through the whole thickness of the auxiliary layer (a "hole") then no stress is locally induced in those areas of the auxiliary layer and the resulting effect is similar as if the auxiliary layer in these areas had a locally different CTE (the "low CTE") that is equal to the CTE of the adhering work piece (for example, for a work piece of silicon the CTE is about 3*10−6 K−1 at room temperature). If these "void" areas only are dimples (i.e., the material in the auxiliary layer is locally removed only up to a certain depth within the auxiliary layer) then the magnitude of the locally induced stress is in-between the previous case and the other extreme case when no material is removed from the auxiliary layer. The resulting effect then is similar as if the auxiliary layer in these areas had a locally different CTE (the "low CTE") that is in-between the CTE of the underlying work piece and the CTE of the material of the untreated auxiliary layer (the "high CTE").

In another example, instead of locally removing the polymer, it is also possible to locally treat the polymer physically or chemically in order to, e.g., locally increase the crosslinking degree of the polymer, which may lead, e.g., to a local decrease in CTE (from "high CTE" to "low CTE"). The difference between "high CTE" and "low CTE" that is required for obtaining the desired effect of producing thin, free-standing layers with structured surfaces from an adhering work piece depends on the desired dimensions of these surface structures, the CTE of the adhering work piece, and on other mechanical properties of the auxiliary layer and the work piece material (in particular, their thicknesses and elastic moduli). For example, if the auxiliary layer comprises polydimethylsiloxane, or PDMS, having a CTE of about 300*10−6 K−1 at room temperature in the unpatterned state, and the work piece comprises silicon with a CTE of about 3*10−6 K−1, then patterning the auxiliary layer with areas having a CTE difference of at least 1% compared to the rest of the auxiliary layer is sufficient for producing a structured surface on the work piece (e.g., an auxiliary layer comprising PDMS with areas where the CTE is 297*10−6 K−1 at room temperature and other areas where the CTE is 300*10−6 K−1 at room temperature may be used to produce a structured surface on a work piece comprising silicon).

In yet another example, the auxiliary layer may comprise a material (for example, a metal) characterized by a CTE that is differing from the CTE of the work piece by an absolute value of at least 10*10−6 K−1 at room temperature. For example, for a work piece of silicon having a CTE of approximately 3*10−6 K−1 at room temperature an auxiliary layer comprising aluminum having a CTE of approximately 24*10−6 K−1 at room temperature may be used, and the auxiliary layer may be patterned by locally removing the aluminum (fully or partially to any desired depth within the auxiliary layer).

In yet another example, local material properties other than local CTE may be used to create locally controllable stress patterns in the auxiliary layer, for example local swelling (see below). In addition, other local material properties in the auxiliary layer that may not necessarily actively create stress patterns in the auxiliary layer but that may influence the dynamic evolution of such stress patterns may be locally modified in order to produce locally defined surface structures on the work piece, for example, a modulus of elasticity (such as Young's modulus) may be locally modified in the auxiliary layer, e.g., by locally changing the degree of cross-linking of a polymer in the auxiliary layer.

Other approaches may be used to produce locally controllable stress patterns in the auxiliary layer, as described below. Regardless of what mechanism is used for producing locally defined stress patterns in the auxiliary layer, this induces directly related, locally defined stress patterns in the adhering work piece of solid state material.

Under appropriate conditions, the mechanical stress patterns lead to the peeling off of a thin layer from the work piece, substantially in parallel to the interface between work piece and auxiliary layer ("spalling"). Also, under appropriate conditions, on the face of the produced thin layer that was previously inside the work piece, a pattern of surface structures is formed, and this pattern is dictated by the pattern of local stresses in the auxiliary layer. Furthermore, at the same time a pattern of surface structures is formed on the face of the work piece that becomes newly exposed by the peeling off of the thin layer, and this pattern is substantially the mirror image (more precisely, the three-dimensional complement) of the pattern formed on the surface of the detached layer. The area of the peeled-off thin layer approximately matches the area of the auxiliary layer. Each of the two patterned surfaces formed when the thin layer is peeled off from the workpiece can be used again, i.e., another auxiliary layer may be applied to the newly exposed face of the workpiece or to the newly exposed face of the peeled-off layer. Thus, embodiments of the present invention facilitate repeated peel-off operations, creating further layers with surface structures, both from the remainder of the work piece and from a peeled-off layer.

Embodiments of the present invention also relate to producing thin, free-standing layers of solid state materials with structured surfaces from mono- or polycrystalline semiconductor materials. The present invention may be deployed where thin mono- or polycrystalline silicon disks are needed or desirable (e.g., due to cost considerations), and where one or both faces of those thin disks are to be patterned with surface structures consisting of the same material as the disks themselves. Advantageous applications include the production of cost-effective and efficient mono-crystalline silicon solar cells having surface structures that substantially act as anti-reflective layers or photonic crystals, or structures for micro-electromechanical devices on thin, mechanically flexible substrates. For example, embodiments of the invention facilitate peel-off, from a flat monocrystalline silicon slab, of layers having thicknesses of approximately 50 μm with structured surfaces. On these thin silicon layers, for example, the invention facilitates creation of surface-structure features having lateral dimensions ranging from significantly below one millimeter up to several centimeters. The heights of these features (i.e., the local thickness of the thin layer at the feature) can be controlled from zero (i.e., a correspondingly shaped hole in the thin layer) to above several hundred micrometers, depending also on the lateral dimensions of the feature. Furthermore, each of these "macroscopic" features can be further endowed with a choice of specific "microscopic" surface roughness patterns, where these microscopic patterns consist of or include substantially periodic structures such as lines, valleys, edges, etc. that have vertical and lateral dimensions ranging from below 100 nanometers to above several micrometers, and spatial periods ranging from below 100 nanometers to several tens of micrometers. The dimensions of both the "macroscopic" and "microscopic" features that are produced may be controlled through the locally defined stress patterns in the auxiliary layer as well as the mechanical properties of the auxiliary layer.

In general, the locally defined stress patterns in the composite (auxiliary layer and adhering work piece) that are required for producing thin, free-standing layers of solid state materials with locally controllable patterns of surface structures according to embodiments of the invention may be created by subjecting this composite to one or more external activation factors (e.g., a change in temperature). External activation may create locally defined stress patterns by two different approaches: In one approach a homogeneous external activation may be used (e.g., the whole composite is subjected to the same temperature change) but the auxiliary layer is heterogeneous, i.e., at least one of its material properties is varied within the auxiliary layer according to a predefined pattern (e.g., the CTE of the auxiliary layer is varied locally according to the pattern). In a second approach, a homogeneous auxiliary layer may be used, but here the external activation is heterogeneous according to a certain pattern (e.g., an auxiliary layer having the same CTE everywhere is cooled more strongly at certain predefined locations). Both approaches may be used individually or in combination. Stresses may locally be created e.g. by local volume changes of the auxiliary layer material. This may be done using special active elements (e.g., by having small actuators such as piezoelectric elements embedded in the auxiliary layer material, and then selectively actuating a subset of them) or, more passively, using the material properties of the auxiliary layer (e.g., inducing different thermal expansion at different locations in the auxiliary layer). Also other material properties that influence the stress pattern in the composite (auxiliary layer-work piece) may be locally modified, in particular the thickness of the auxiliary layer and/or the elastic modulus of the auxiliary layer. Finally, also material properties that influence the dynamic evolution of the stress pattern (e.g., how the stress pattern changes locally during the splitting off of the thin layer, e.g., dynamics of crack propagation such as crack tip oscillations) may be locally modified, in particular the elastic moduli. For example, it is known that the non-dimensional elastic moduli dependence of bimaterial systems, for traction-prescribed boundary value problems, may be expressed in terms of two bimaterial parameters, Sigma, the stiffness ratio of the two materials, and epsilon, the oscillatory index. It is also known that for a bimaterial system consisting of a work piece of one material and an auxiliary layer of a second material (taking each material to be isotropic and linearly elastic, with a semi-infinite crack pre-existing in the work piece parallel to the interface, and the work piece and the auxiliary layer assumed infinitely long) the steady-state solution for the spalling problem (e.g., the thickness of the produced thin layer) substantially depends on the thickness of the auxiliary layer as well as on the stiffness ratio Sigma, but only weakly on the oscillatory index beta. Therefore, in an example of an embodiment of the present invention, locally defined and relatively large variations in the thickness of the produced thin layer are achieved by locally varying the thickness of the auxiliary layer and/or its stiffness. Also, locally varying the oscillatory index allows to modify the local properties (e.g., period or amplitude) of relatively smaller (in terms of thickness variation, i.e., amplitude), substantially periodic structures that are produced on the surface of the thin layer by oscillatory behavior at the crack tip.

A major advantage of the invention lies in significant reduction of the number of processing steps required to produce thin, free-standing layers of solid state materials with structured surfaces. In contrast to traditional methods, the processes for cutting thin layers from a thicker piece of solid state material, and the subsequent processes for forming controllable surface structures on these layers (such as polishing, cleaning, mask deposition, mask patterning, pattern transfer and surface etching, mask removal) are all combined into a single, much simpler and significantly less expensive process sequence. Furthermore, the present approach significantly reduces the material loss that occurs during the production of thin, free-standing layers of solid state materials with structured surfaces. In contrast to previous methods that employ, e.g., sawing, grinding, polishing, or etching, the present approach incurs almost no loss of valuable feedstock material. When peeling off a patterned thin layer from a work piece, the feedstock remains almost completely distributed between the peeled-off layer and the remainder of the work piece, with the surface structure patterns on the thin layer and work piece substantially being complementary to each other.

Another advantage of the invention is the ability to implement it using significantly less expensive equipment. Embodiments of the invention can be readily integrated into existing production methods, e.g., for the production of thin silicon solar cells with structured surfaces.

Finally, an advantage of the invention is that it can be applied to many different types of solid state materials.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

The present invention is related to a method for producing thin, free-standing layers of solid state materials with structured surfaces. The following illustrative embodiments of the invention are described with reference to FIG. 1.

Figure 1:
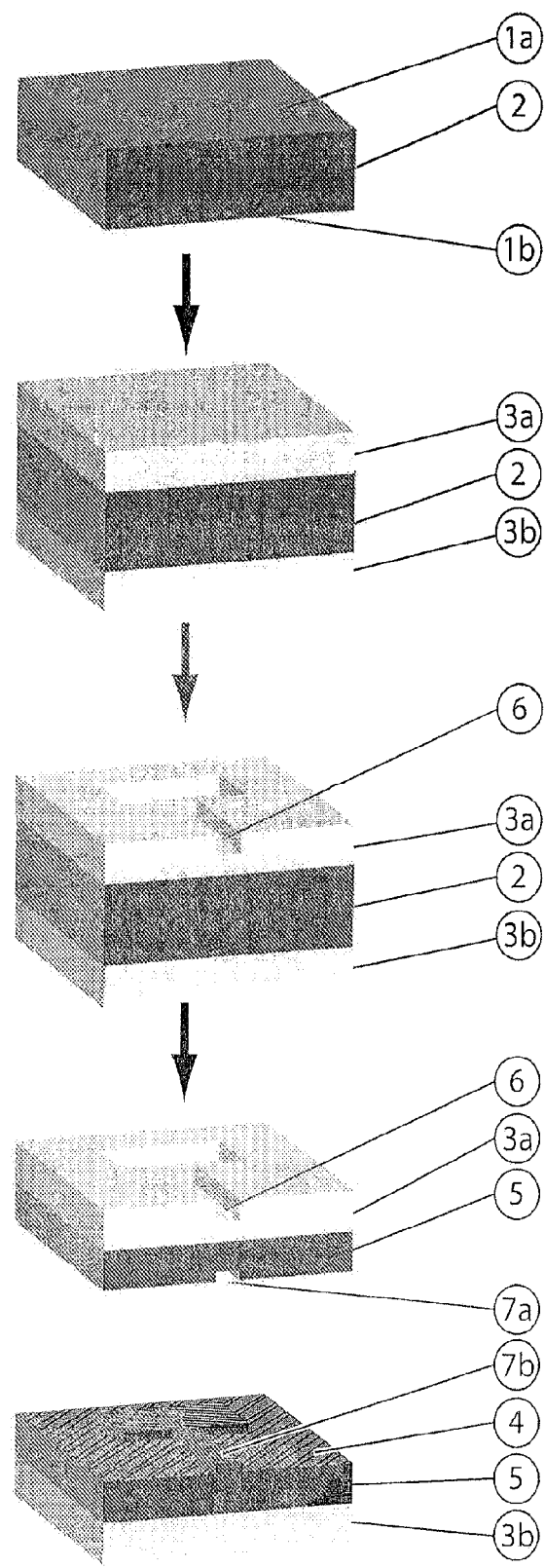
FIG. 1 illustrates schematically the process sequence of the present method in four steps (from top to bottom), in perspective view.

In a first embodiment, the work piece 2 is a commercially available monocrystalline silicon wafer. FIG. 1 presents schematically a representative process sequence in accordance with the invention, in four steps (from top to bottom), in perspective view. In the following reference signs are with respect to FIG. 1.

STEP 1: The basic raw material here is a monocrystalline silicon wafer 2, produced in accordance with the Czochralski-method as it is used, e.g., in the microelectronics or photovoltaics industry. The wafer 2 has a diameter of approximately 76 mm and a thickness of approximately 0.4 mm.

The wafer is lightly n- or p-doped, has a specific electrical resistivity of approximately 10 Ohm cm, and its two faces 1a and 1b are oriented parallel to a <100> crystal plane. One or both faces 1a and/or 1b of the wafer may be mirror-polished or simply etched and lapped. The wafer 2 can be used straight out of wafer production, or it can be roughly pre-cleaned using conventional methods (e.g., with organic solvents and water, or by plasma oxidation cleaning).

STEP 2: On each face 1a and 1b of the wafer 2 a thin layer 3a, 3b of polydiorganolsiloxane (e.g., polydimethylsiloxane, or PDMS; the ensuing discussions refer to PDMS for convenience, but it should be understood that any suitable silicone polymer or copolymer may be employed) is applied and cured (or allowed to cure). The preferred thicknesses of these auxiliary layers 3a, 3b are between 0.01 mm and 10 mm, with a thickness of between about 0.3 mm and about 3 mm more preferred. The thicknesses of the two layers 3a, 3b are the same in this illustrative embodiment, but in other embodiments the thicknesses of the two layers may differ. For the PDMS it is possible to use, e.g., SYLGARD 184 by Dow Corning, with a mixing ratio of 1:10 between curing agent and base material. The liquid PDMS-mixture is first degassed approximately for one hour in vacuum, then it is applied on each face 1a, 1b of the wafer 2 in the desired thickness, and cured on a hotplate (e.g., for 30 minutes at 100° C.). In this illustrative embodiment PDMS layers 3a, 3b have homogeneous thicknesses over most of the wafer area. This can be achieved by putting the wafer on a horizontal surface and letting the PDMS equilibrate by gravity before curing it. After the PDMS is cured, the three-layer composite (PDMS 3a—wafer 2—PDMS 3b) is cooled down to room temperature. After that, any PDMS protruding along the circumference of the wafer 2 is removed with a sharp knife, such that the edge of the wafer 2 is essentially free of PDMS, and PDMS covers only the two faces 1a, 1b of the wafer 2. It is possible to avoid having any PDMS protrude over the circumference of the wafer (and thus touch the edge of the wafer) by applying the PDMS to the wafer faces carefully and letting it equilibrate on a horizontal surface; in this way the surface tension of the PDMS will keep it from overflowing onto the wafer edges.

STEP 3: Then, a patterning step is performed: A tool, such as a sharp knife or razor blade, is used to cut an arbitrary pattern 6 of lines and/or other geometrical figures (such as circles, etc.) into the surface of one of the PDMS layers 3a. In this embodiment, all cuts have the same depth into the PDMS layer 3a, which is less than the thickness of the PDMS layer 3a (i.e., the PDMS layer 3a is nowhere cut completely through to the wafer surface 1a). For example, for a PDMS layer 3a having a preferred thickness of 1 mm, preferred depths for these cuts range from 0.01 mm to 0.99 mm, more preferably from 0.1 mm to 0.9 mm.

STEP 4: After the patterning step, the composite (PDMS 3a—wafer 2—PDMS (3b)) is completely immersed in a liquid nitrogen bath (temperature approximately −200° C.). Due to the strongly differing thermal expansion coefficients of silicon (approximately $3*10^{-6}$ $K^{-1}$) and PDMS (approximately $300*10^{-6}$ $K^{-1}$), large mechanical stresses are induced in the composite by this cooling. However, in areas that are part of the pattern 6 where the PDMS layer 3a has been cut, the mechanical stresses are locally different, depending on the arrangement and depths of the cuts. After a few seconds of cooling, the wafer 2 splits spontaneously, parallel to its surface 1a, into two thin, monocrystalline silicon disks 5, with one side of each disk 5 still having the corresponding PDMS auxiliary layer 3a or 3b adhering.

With adequate care, each of the two silicon disks 5 consists essentially of one single piece, with the face where the split occurred showing an image 7a or 7b of the pattern 6 on its surface 4. The image patterns 7a and 7b on the two silicon disks 5 are substantially complementary. The features in each of the image patterns 7a and 7b may comprise areas of different surface roughness, different surface heights (i.e., different local thicknesses of the corresponding silicon disk 5), or other differences in surface properties compared to the surrounding areas. The lateral characteristics of the pattern 6 are reproduced substantially in the complementary images 7a and 7b, at the same scale. Features in the pattern 6 that have lateral dimensions greater than about 0.1 mm can be replicated in the image patterns 7a and 7b. In order to avoid additional breaking perpendicular to the surface 4, the disks 5 may—after the splitting—be transferred directly out of the liquid nitrogen bath onto a 100° C. hotplate (with the side having the PDMS auxiliary layer 3a or 3b adhered facing down), until the whole PDMS auxiliary layer has warmed up again at least to room temperature. Whatever warming procedure is employed, it is preferred that the disks 5 are carefully pressed against a flat support as they warm so that any curling of the layers is reversed, to flatten the layers as the warming proceeds.

The thin silicon disks 5 with surface patterns 7a and 7b produced according to this method consist substantially of monocrystalline silicon with the same properties as the original wafer 2 and can be directly used. Alternatively, the PDMS auxiliary layers 3a or 3b can also be removed from the silicon disks 5, for example by immersion in an appropriate liquid etchant (e.g., a 3:1 mixture by volume of NMP (N-methylpyrrolidone) and TBAF/THF (tetrabutylammoniumfluoride, 1.0M solution in tetrahydrofuran), or also by immersion in hydrofluoric acid). A preferred way for removing the PDMS auxiliary layers 3a or 3b is by rinsing with, or immersion in a bath of, hot sulfuric acid ($H_2SO_4$) etchant, preferably at a temperature above 150° C. (and more preferably above 200° C.), then removing the produced white silica foam mechanically (e.g., using a brush, and possibly several brushing-etching cycles), and finally cleaning the silicon disk 5 by immersion in hydrofluoric acid.

In a second illustrative embodiment, the patterning step (STEP 3) is performed using irradiation with a laser beam instead of cutting with a sharp knife. The laser preferably has a frequency that is strongly absorbed by PDMS (a $CO_2$ laser meets this criterion), and preferably the intensity and the motion of the beam over the PDMS layer 3a is controlled in an automated or manual fashion to cut a desired pattern. Commercially available laser cutters (e.g., VERSA LASER VLS 6.60, with 60 Watt $CO_2$ laser) are acceptable. The depth of the cut may be varied in any of several ways that may be employed individually or in combination: the laser beam can be focused at different depths, the laser intensity can be varied, the scanning speed of the laser beam over the PDMS surface 3a can be varied, the pulse rate of the laser can be changed, and the laser beam can be passed over the same spots on the PDMS surface 3a repeatedly (possibly with surface cleaning steps between passes).

In a third embodiment, the patterning step is performed using chemical etching instead of cutting with a sharp knife, possibly using a mask layer on the surface of the PDMS, and possibly in combination with knife or laser cutting.

In a fourth embodiment, the patterning step is performed by locally burning the PDMS surface 3a at selected locations, but instead of using a laser beam, a hot stamp featuring an embossed shape of the desired pattern is pressed onto the PDMS surface 3a. The hot stamp is preferably at a temperature above the PDMS decomposition temperature, more preferably above 550° C.

In a fifth embodiment, the patterning step is performed using any of various possible cutting mechanisms, such as the ones mentioned earlier. In this case, however, not only are lines cut into the PDMS surface 3a, but so are laterally extended, two-dimensional features such as disks, which are also imposed into the PDMS surface 3a. This can be done by, for example, using a laser in a raster fashion to create these features based on image data used to control laser firing in the manner of a scanner.

In a sixth embodiment, the patterning step in the present method is performed using any of various cutting mechanisms, such as the ones mentioned earlier. However, here the depth of the cut is not kept constant throughout the pattern 6 but rather is locally varied in a pre-determined way. In other words, the features of the pattern 6 can be given different depths. In this way, for example, features with locally different heights can be produced in the image patterns 7a and 7b. In an extreme example, cuts may be performed all the way through the PDMS layer 3a onto the surface 1a of the wafer 2. If this is done, e.g., for a pattern 6 consisting of filled circles (i.e., disks), one of the two produced disks 5 will have an image pattern 7a of through-holes, and the other one will have the corresponding complementary pattern 7b of shaped mesas with the same thickness as the original wafer 2.

In a seventh embodiment, the patterning step is performed not by cutting patterns into the PDMS auxiliary layer 3a, but rather by locally modifying the properties of the PDMS layer 3a at certain locations corresponding to the features of the desired pattern. For example, the mechanical properties of PDMS, and in particular its CTE, can be locally modified using the following technique [Huck et al., *Langmuir* (2000), 16:3497-3501]: The PDMS layer 3a is soaked for 5 h in a 0.25 M solution of benzophenone in dichloromethane. The PDMS layer 3a is then dried for 24 hours in air, in the dark. This treatment increases the sensitivity of PDMS to irradiation with ultraviolet (UV) light, since the benzophenone—a photosensitizer—generates radicals upon irradiation; these radicals cross-link PDMS. The PDMS layer 3a is then exposed to UV irradiation (e.g., 254 nm, 10-30 min) through an amplitude photomask showing the desired pattern 6. The exposed regions of the PDMS layer 3a become stiffer and less elastomeric, and have a CTE and elastic modulus that are different from those of the surrounding areas. Instead of irradiating the sensitized PDMS with UV light patterned by a mask, the sensitized PDMS may instead be exposed, e.g., using a UV laser. Furthermore, selectively enhanced crosslinking of PDMS (which locally modifies its CTE and other mechanical properties that may influence local stress generation) at locations corresponding to the features of a desired pattern may be achieved, e.g., through irradiation with an infrared laser that selectively heats certain patterns on the surface of the PDMS layer 3a without burning it.

In an eighth embodiment, the patterning step is performed not by cutting patterns into the PDMS auxiliary layer 3a, but rather by locally modifying the properties of the PDMS layer 3a at locations corresponding to features of the desired pattern. For example, the mechanical properties of PDMS, and in particular its CTE and/or its elastic modulus, can be locally modified by locally embedding other materials with different properties (such as different CTE and/or different elastic modulus)—glass beads, air bubbles, metal particles, fibres etc.—into the PDMS layer.

In a ninth embodiment, the patterning step is performed by using a heterogeneous auxiliary layer 3a comprising at least one patterned layer and at least another non-patterned layer, possibly made from different materials, and possibly with different properties (such as different CTEs). In one implementation, before applying the PDMS, a metal structure with the pattern 6 is deposited on the surface of the wafer 2, e.g., using screen printing techniques or lithography and physical vapor deposition. PDMS is then applied over both this metal structure and the wafer (thereby partially embedding the metal structure), and is then cured. Since for the metal structure properties such as the CTE are different from those of the PDMS, the produced thin disks 5 have surface structure patterns 7a and 7b that are substantially the images of the pattern 6 of the metal structure.

In a tenth embodiment, the present method is used to split a wafer 2 into two thin disks 5, and the pattern 6 used is a mirror symmetric pattern. This produces two thin disks 5 having image patterns 7a and 7b that are substantially identical, i.e., two identical products ("devices") can be produced "in one step," i.e., using only one application of the present method. The properties of the PDMS auxiliary layers 3a and 3b (e.g., their thicknesses) may be chosen such that the thicknesses of the two produced thin disks 5 are the same, or that they are different from each other.

In an eleventh embodiment, the present method is used with a certain pattern 6 in the PDMS layer 3a on one side of the wafer, and another pattern 6' in the PDMS layer 3b on the other side of the wafer. The pattern 6' may be the same as the pattern 6, or it may be a different pattern. The image patterns 7a and 7b on the thin disks 5 that are produced by the method according to this embodiment are then substantially combinations (e.g., superpositions) of the patterns 6 and 6'.

In a twelfth embodiment, the present method is first used with a certain pattern 6 in the PDMS layer 3a and/or a pattern 6' in the PDMS layer 3b to produce two thin disks 5, one having a corresponding image pattern 7a and the other one a corresponding mirror image pattern 7b on one side. Each of the two disks 5 usually still has a PDMS layer 3a or 3b adhering on the other side. These layers may then be replaced with fresh PDMS layers, but it is preferred to leave these layers 3a and 3b adhering to their respective disk 5. Regardless whether they are replaced or re-used, these layers 3a and/or 3b may then be patterned if desired, or their pattern may be modified if they already were patterned (with patterns 6 or 6') during the first iteration of the method (i.e., for producing the two thin disks 5). The method is then applied again by depositing new PDMS auxiliary layers for the next iteration onto those sides of the two thin disks 5 that do not yet have a PDMS layer adhering (i.e., the sides having the surface structure patterns 7a or 7b). None, one or both of these new PDMS auxiliary layers may be patterned if desired (with any desired pattern). The second iteration of the method then produces a total of four thinner disks, where two out of those four thinner disks (in general) have locally controllable patterns of surface structures on both sides, i.e., comparable to double-sided printing: On one side they have an image pattern 7a (or its mirror image 7b, respectively) corresponding to a superposition of the patterns 6 and 6' in the old PDMS auxiliary layers 3a and 3b during the first iteration, and on the other side they have an image pattern that corresponds to a superposition of any (possibly modified) pattern in the old PDMS auxiliary layers 3a (or 3b) and any pattern in the corresponding new PDMS auxiliary layer. In this way, thin, free-standing layers of solid state materials with similar or different structured surfaces on both sides can be produced. (The method according to this embodiment at the same time produces also two other thinner disks that only have surface structures on one side, corresponding to image patterns from the second iteration). Note that the surface structures on the thin disks 5 produced during the first iteration may somewhat influence the stress patterns and thus the produced surface structures during the second iteration, however, this influence is usually small (since the thickness of the produced surface structures is usually much smaller than the thickness of the disks) any it may also be compensated using appropriate patterning of the auxiliary layers for the second iteration.

In a thirteenth embodiment, instead of having a pattern 6 of regions with locally different CTE in the PDMS layer 3a and subjecting the composite structure to a temperature change, it is also possible to employ other mechanisms to induce locally differing stresses (i.e., a stress pattern) in the PDMS layer 3a. For example, instead of using the same temperature change for the whole PDMS auxiliary layer, different temperature changes may be imposed at different locations in the PDMS auxiliary layer, for example, by selectively cooling certain areas in the auxiliary layer more strongly than others, e.g. using contact with a cooled stamp that has the desired pattern 6 embossed, or by cooling the whole layer and selectively re-heating certain areas e.g. with a laser. In this way it is possible to produce patterns of locally differing stresses even using a homogeneous PDMS auxiliary layer (for this embodiment it is preferred to use an auxiliary layer material with relatively low thermal conductivity, such as PDMS). More generally, locally definable stress patterns can be produced by subjecting the auxiliary layer to patterns 6 of locally varying, externally applied physical or chemical conditions (that may furthermore also be temporally varying), e.g. light patterns, heat patterns (different areas having different temperature), solvent patterns (different areas having different solvent concentrations), patterns of electric or magnetic fields, patterns of external mechanical forces acting on the auxiliary layer, etc. The auxiliary layer preferably comprises at least one material that interacts with these patterns 6 of externally applied physical or chemical conditions by (locally) changing its volume (e.g., a material that expands under UV light, or in an electric/magnetic field, etc).

In a fourteenth embodiment, another alternative method for inducing patterns of locally differing stresses is to include active devices such as piezo-electric actuators at certain locations in the PDMS layer 3a and actuate them (e.g., electrically, optically) to generate a stress pattern in the PDMS layer 3a. More generally, locally definable stress patterns can be produced by embedding, into the PDMS layer 3a, patterns 6 of different materials that undergo different volume changes when activated by a chemical or physical mechanism. Mechanisms that can achieve such a volume change include, in addition to temperature change, a change in humidity (e.g., swelling, de-hydration), a change of solvent composition and/or ionic strength (e.g., osmotic pressure actuators, polyelectrolyte gels, ionic polymer metal composites, conducting polymers, carbon nanotube actuators), a change of pH, phase changes (e.g., freezing of embedded solvent), chemical reactions (e.g., polymer gels), electric activation (e.g., piezoelectric or electrostrictive materials, electrostatic actuators, electro-active polymers), magnetic activation (e.g., "magnetic" gels), optical activation (e.g., liquid crystal elastomers, photo-reactive materials), etc, as well as combinations of any or all of those. Also, instead of locally embedding patterns of different materials into the PDMS layer 3a it is possible to locally modify the PDMS itself (chemically) in order to achieve the desired locally different volume changing behavior, e.g., by locally adding different functional side chains to the polymer, or locally changing the degree of cross-linking e.g., by UV irradiation.

In a fifteenth embodiment, the initiation of the splitting in step 4 is facilitated and control of the splitting process is improved by providing the wafer 2 with one or more structurally weaker zones at certain specific locations on the wafer surface. For example, one or more small defect zones can be created at the edge of the wafer 2. Such defect zones can be created mechanically (e.g., by hitting a certain spot on the wafer edge with a sharp pointed hammer, thereby locally shattering the crystal structure and creating a dent or nick, or by sawing, filing, or milling, etc., in order to create a groove or notch), chemically (e.g., locally etching a groove), optically (e.g., locally melting the material using a laser, or ablating it to create groove structures), or by other suitable mechanisms. Splitting will then preferentially start at those defect zones and propagate over the rest of the wafer area from there. In particular, this is advantageous since by varying the location of these defect zones it is possible to better control the initial depth of the splitting, i.e., the thickness of the produced thin disks 5 at their edges, and in general improve the quality of the edges of the disks 5. For example, a groove in the edge (i.e., around the circumference) of the wafer 2 half-way in-between the two faces 1a and 1b may facilitate splitting into two thin disks 5 of equal thickness and with clean-cut edges. The weaker zones according to this embodiment may be created before stress is induced in the work piece (e.g., before cooling), or they may be created while the wafer is already under stress. The second method also allows to better control the moment in time when splitting starts: If stress is built up in the wafer up to a magnitude just slightly below the critical value where the splitting process would begin spontaneously, then, as soon as a weakness is created, splitting will start, preferentially from the location of that weakness.

In a sixteenth embodiment, instead of simply letting the wafer split spontaneously, the initiation of the splitting in step 4 is facilitated by subjecting the wafer 2 to controlled shock, e.g., a short shock wave. For example, a shock wave in the wafer can be induced by one or more controlled blows with a mechanical device such as a hammer (peening), by delivering ultrasonic pulses, or by strong laser pulses, etc. The spatial distribution, intensity and temporal characteristics of such shock waves facilitates modulation of and better control over the splitting process.

In a seventeenth embodiment, the present method is used on a wafer 2 that already has existing surface structures on at least one of its two faces 1a or 1b. Such existing surface structures (such as trenches, mesas, membranes, cantilevers, pyramids, etc.) can be formed from the wafer material itself, or they can involve additional materials (e.g., metallic contacts, anti-reflection layers, dielectric layers, epitaxial layers, etc.), or any combination thereof. The PDMS is then applied over these existing structures, covering and conformally surrounding them, so that after curing the PDMS these existing structures become partially embedded in the PDMS layers 3a and/or 3b. When the wafer 2 is split into two thin disks 5, these existing surface structures are preserved on the side of each disk 5 that still has the corresponding PDMS auxiliary layer 3a or 3b adhering thereto, whereas the other side of each disk 5 shows a new surface structure 7a or 7b created by the present method as an image of the pattern 6. In this way thin, free-standing layers can be produced with complex surface structures on one side (possibly also involving additional materials, and even providing complete functional devices such as electronic, optical, chemical, or micro-mechanical devices) and other surface structures on the other side, where those other surface structures are formed from the wafer material and determined by the pattern 6 in the PDMS layer. Note that the pre-existing surface structures on the faces 1a and/or 1b may somewhat influence the stress patterns and thus the produced surface structures 7a and 7b, however, this influence is often small (since the thickness of the pre-existing surface structures is often much smaller than the thickness of the disks) any it may also be compensated using appropriate patterning of the auxiliary layers 3a and/or 3b.

In an eighteenth embodiment, the present method is used on a wafer 2 that already has existing internal (bulk) structures, such as, e.g., one or more dopant gradients. When the wafer 2 is split into two thin disks 5, these existing internal structures are preserved in the corresponding thin disks 5. In this way thin, free-standing layers with structured surfaces can be produced that have internal (bulk) structures such as dopant gradients.

In a nineteenth embodiment, combining aspects from the previous two embodiments, the present method is used on a wafer 2 that already has both existing surface structures and existing internal (bulk) structures. In particular, the wafer has partially or completely functional devices (electronic, optical, micro-mechanical, chemical, etc.) on one or both of its faces 1a and/or 1b. Such devices may include LEDs, laser diodes, solar cells, tandem solar cells, power amplifiers, integrated circuits in general, micro-electromechanical devices such as sensors or actuators, etc. The PDMS is then applied over these existing devices on the wafer faces, covering the devices, and conformally surrounding them on the outside, so that after curing the PDMS these existing devices become partially embedded in the PDMS layers 3a and/or 3b. When the wafer 2 is split into two thin disks 5, these existing devices are preserved on the side of each disk 5 that still has the corresponding PDMS auxiliary layer 3a or 3b, respectively, adhering, whereas the other side of each disk 5 shows a new surface structure 7a or 7b created as an image of the pattern 6. In this way thin, free-standing layers of solid state materials can be produced that have complex, partially or already completely functional devices on one side, and other surface structures on the other side, where those other surface structures are formed from the wafer material and determined by the pattern 6 in the PDMS layer.

As an illustrative example for an application of the previous embodiment, the surface structures and internal structures that make up the front part (i.e., the side that is illuminated during normal operation) of a conventional silicon solar cell (e.g., front-side doped layer including pn-junction, front metal contact grid, anti-reflective coating) are considered and in the following referred to as "front-structures." Now, instead of producing these "front-structures" only on one side of a wafer as is conventionally done, such "front-structures" are manufactured onto both sides 1a and 1b of a thick monocrystalline silicon wafer 2. Then this wafer 2 is split into two thinner disks 5 as described above, whereby the device layers are preserved, such that each of these two disks 5 now has "front-structures" but only on one side (i.e., the side still having the corresponding PDMS layer 3a or 3b adhered). On the other side of each of the two disks 5 is a "fresh" surface consisting of bulk wafer material, with a surface structure 7a or 7b determined by a pattern 6 in the PDMS. The "fresh" surfaces of both disks can now be further processed using conventional methods for making the back sides of silicon solar cells (e.g., back-surface field doping, back-side contact metallization, etc.), completing the manufacturing of two silicon solar cells. This example shows a number of advantages: most of the solar cell manufacturing steps can be done on a relatively thick (and therefore less fragile) wafer 2, which facilitates use of inexpensive processes such as screen-printing of the contacts, and simplifies wafer handling in general. Also, the same (front-side) dopant can be diffused into the whole surface of the wafer, i.e., into both its sides 1a and 1b, and there is no need, for example, to subsequently remove the dopant from the back of the wafer (since that is automatically achieved by the splitting process). The same holds for, e.g., an anti-reflection coating, which can also be produced on the whole wafer (e.g., oxidative growth of $SiO_2$ and/or PECVD deposition of $Si_3N_4$ nitride) and then automatically is confined to one side through the splitting process. In this way a number of processing steps for solar cell manufacturing can be eliminated or simplified by application of the present method. These benefits are particularly pronounced in another illustrative example, where, instead of standard solar cells with front and rear contacts, back-contact solar cells are manufactured: here, almost all of the functional structures are on one side of the cell (the back-side). If such back-side structures are manufactured onto both faces 1a and 1b of a thick mono-crystalline silicon wafer 2, then, after the splitting using the present method, both of the produced thin disks 5 are almost-finished back-contact cells already (possibly only requiring deposition of an anti-reflection coating on the other side). Therefore, the present method can be applied to produce thin, mono-crystalline silicon back-contact solar cells without the need for handling thin wafers through most of the process.

In another aspect, the invention relates to a device comprising a slab (block, ingot, disk, etc.) of a solid state material divided by a gap into two pieces, one piece being the geometrical complement of the other piece, so that by reducing the gap to zero, the shape, dimensions and mass of the original slab can be retrieved, substantially without any material missing (e.g., without internal voids, etc.). At least one of those two pieces is a thin layer, i.e., it is substantially a flat or curved sheet having an area of at least 1 $cm^2$, and throughout this area its thickness is smaller than 2 mm, preferably smaller than 0.5 mm. At least one of the thin-layer pieces itself has a layer of at least one additional solid state material (referred to as auxiliary layer) adhered to it on the face opposite to the gap. For each of the two pieces, those surfaces facing the gap do not contain materials other than the ones that are found in the bulk of the slab (except possibly for, e.g., a native oxide layer if the surfaces are reactive with and exposed to air).

In another embodiment, the invention relates to a device as described above but where, for each of the two pieces, the surfaces facing the gap show a structure according to some pattern, with the surface structures 7a on one piece being substantially complementary to the surface structures 7b on the other piece, and with the pattern being substantially a full-size image of a corresponding pattern 6 in at least one layer of at least one additional solid state material (auxiliary layer) adhered to at least one of the two pieces. The pattern 6 in the auxiliary layer is realized by having parts of the auxiliary layer exhibit local material properties (such as locally different CTE or locally different elastic modulus) different from those of the surrounding areas, which, for example, may include parts where the material of the auxiliary layer is partially or completely removed (i.e., void structures). In another embodiment, the pattern 6 may be a pattern of stresses that is temporarily induced in the auxiliary layer by applying patterns of external physical or chemical influences on the auxiliary layer, such as light patterns, heat patterns, patterns of external mechanical forces acting on the auxiliary layer, etc.

The approach of the present invention can also be used to produce thin, free-standing layers with structured surfaces from work pieces that consist of solid state materials other than monocrystalline silicon (e.g., polycrystalline silicon, sapphire, germanium, quartz, or amorphous materials such as glass). Also, this approach can be used with work pieces that are composed of several different materials (homogeneous or inhomogeneous composite materials, etc.) or that have an internal structure (laminates, etc.). For example, the approach can be used for work pieces consisting of a monocrystalline silicon wafer with an epitaxially grown layer such as gallium nitride (GaN) on its surface. Furthermore, for the auxiliary layers that are applied onto the work piece, materials other than PDMS—e.g., other polysiloxanes (which can include organometallic groups for, e.g., electric activity) other elastomers, other polymers or plastics in general, or metals such as aluminum or silver, etc.—may be used. It is also possible to utilize auxiliary layers that are composed of several different materials (homogeneous or inhomogeneous composite materials, etc.) or that have an internal structure (laminates, etc.). In general, the work piece is a relatively brittle solid state material. Good adhesion between work piece and auxiliary layer should be achieved and maintained throughout the process, and the auxiliary layer should be amenable to convenient processes for imposing sufficiently strong stress patterns without breaking the auxiliary layer itself.

Also, the PDMS (or other polymer) in the auxiliary layer can be cured (i.e., its polymer chains cross-linked) by means other than heating it on a hotplate. For example, it may be heated by blowing a hot gas over it, or irradiating it with, e.g., infrared light. Alternatively or in addition, curing may be accomplished using chemical additives, ultraviolet radiation, or electron beam. The PDMS (or other polymer, or in general any material in the auxiliary layer) may also be chemically modified to facilitate a particular form of cure (or, in general, solidifying, possibly generating internal stress inside the layer during solidification already), for example, curing PDMS by UV irradiation may be facilitated, e.g., by immersing the PDMS in benzophenone (a photosensitizer that generates radicals under irradiation), or by, e.g., replacing the methyl groups in the PDMS with photoreactive substituents.

Similarly, a number of alternative methods may be used to remove the auxiliary layer from the disks 5 at the end of the process. Instead of, or in addition to chemically etching away the auxiliary layer as described above, the layer may also be removed mechanically, by irradiation, electron beam, and/or heat. For example, a PDMS auxiliary layer can be mechanically peeled off from a thin disk 5 of monocrystalline silicon if the face of the disk opposite to the PDMS layer is temporarily fixed (e.g., glued) to a support, and then, e.g., starting from a corner, the PDMS is slowly and carefully peeled off by pulling it in a direction substantially vertical to the surface of the disk, possibly facilitated by inserting a wedge or similar item between the PDMS layer and the disk 5. Alternatively, PDMS (or other polymers) may simply be heated up, e.g., with a laser or in an oven, above its decomposition temperature (i.e., removal by ashing). It may also be removed by ashing in a plasma, e.g., in an oxygen plasma. The PDMS may also be chemically modified such that it decomposes more easily, e.g., under UV irradiation. Finally, any or all of these approaches may be combined (and straightforwardly adapted if materials other than PDMS are used for the auxiliary layer).

The present approach can be applied to work pieces of almost arbitrary shape and is not limited to planar wafers. In particular, the present invention may be used, e.g., to peel off thin sheets with structured surfaces directly from a monocrystalline silicon ingot that is flattened on one side. To peel off a flat sheet it is sufficient that the work piece used is confined by at least one flat surface. On this surface the auxiliary layer is then applied. It is possible to only peel off one sheet, or several sheets can be peeled off from different surfaces of a work piece at the same time. Finally, the present approach can also be applied for producing thin, free-standing curved sheets or shells with structured surfaces. To this end, the auxiliary layer is applied onto a correspondingly curved surface of the work piece. The temperature change (or other stress-inducing process) then leads to the splitting off of a thin, correspondingly curved sheet or shell from the remainder of the work piece along a patterned fracture zone inside the work piece. This patterned fracture zone runs everywhere approximately at the same distance to the interface between work piece and auxiliary layer, so that the produced sheet with surface structure patterns has an approximately uniform thickness (except for the patterns 7a and 7b, where thickness variations may be deliberately produced)

The surface properties of the surface onto which the auxiliary layer is applied are not critical. The interface may be smoothly polished, or it may have significant roughness. It is only important to retain adequate adhesion to the auxiliary layer. In particular, the fracture surface, which is formed on the remainder of the work piece when peeling off a sheet from the work piece, can be used subsequently as the surface onto which the auxiliary layer is applied. Thus the present approach can be re-applied on the remainder of the work piece. In this way sheet after sheet can be successively peeled off from a single work piece.

Also, from a peeled-off thin, free-standing layer with structured surfaces, further (thinner) layers can be peeled off by repeating the same steps. For example, using the present method, a monocrystalline silicon wafer can be split into two disks with structured surfaces by applying PDMS auxiliary layers onto both sides; neither, one or both of these auxiliary layers can have a pattern 6, and if both have patterns, these patterns can be the same or different from each other. Each of these produced two thinner disks can then again be provided on both sides with a PDMS auxiliary layer, again with neither, one or both of them having patterns (6) that may be the same or different, and, repeating the steps of the method, can thus be further split into two even thinner disks with structured surfaces (having different surface structure patterns, if desired), and so on. In this way, a large number of thin monocrystalline disks with structured surfaces can be obtained from a single monocrystalline silicon wafer. For example, in three steps, eight approximately 50 μm thick disks with custom structured surfaces can be obtained from a customary 0.4 mm thick wafer.

In general, the dimensions of the thus-produced thin, free-standing layers, in particular their thicknesses, can be set through appropriate choice of the stress inducing mechanism (e.g., the temperature change), and/or the properties of the auxiliary layer. This is achieved in particular through appropriate choice of the time flow of the stress induction, the magnitude of the stress induced, the dimensions of the auxiliary layer, the geometric shape of the auxiliary layer, and/or the mechanical and/or thermal/optical/chemical/hydrostatic/piezoelectric/etc properties of the auxiliary layer.

The auxiliary layer may, e.g., be applied in liquid or gaseous state onto the corresponding surface of the work piece, and then be solidified there. Alternatively, the auxiliary layer can also be adhered directly in the solid state onto the surface. The adhesion between the auxiliary layer and the surface of the work piece can be achieved through chemical bonding, van-der-Waals forces, or other strong adhesive forces. Also an adhesion through alloying of auxiliary layer and work piece material at the interface, or adhering the auxiliary layer by means of a third material (e.g., an adhesive) onto the surface of the work piece, are possible for the implementation of the present method.

Finally, instead of liquid nitrogen, other coolants (e.g., liquid helium, ice water, or cooling solids or cooling gases, etc.) may be used to build up, by cooling, the necessary mechanical stresses inside the auxiliary-layer-work-piece composite. In certain cases it is sufficient to simply cool down the composite to room temperature, so that a special coolant will not be needed. Furthermore, it is possible in certain cases to achieve the necessary mechanical stresses inside the composite by warming up instead of cooling down. Essential for building up the necessary mechanical stresses at a certain temperature T are a sufficiently large difference in thermal expansion between work piece and at least parts of the auxiliary layer, as well as a sufficiently large difference between the temperature T and the temperature at which the auxiliary layer was adhered onto the work piece.

Figure 2:
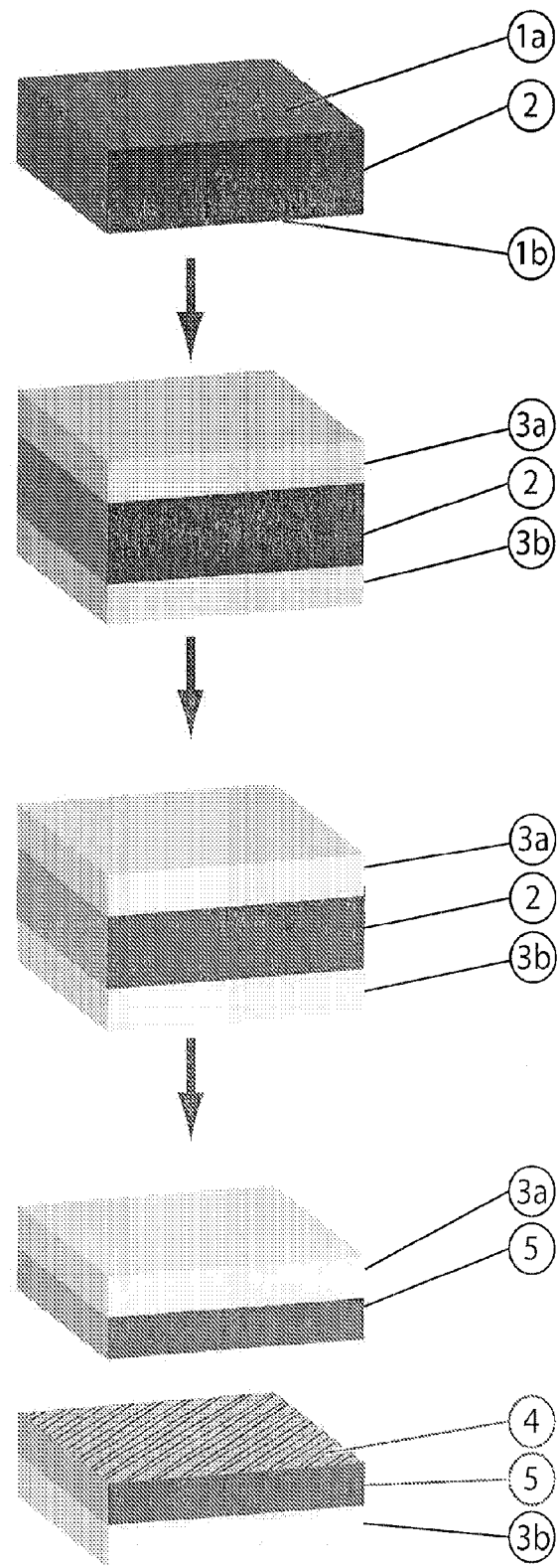
FIG. 2 illustrates schematically the process sequence of the present method in four steps (from top to bottom), in perspective view.

Second Independent Embodiment (FIG. 2)

According to a different aspect of the present invention is disclosed an independent method for producing thin, free-standing layers of solid state materials by stress-induced splitting (spalling) from a work piece, in particular a method that enables the use of inexpensive and little-contaminating materials such as polymers in a stress inducing auxiliary layer.

In a first embodiment, the work piece 2 is a commercially available monocrystalline silicon wafer. FIG. 2 presents schematically a representative process sequence in accordance with the invention, in four steps (from top to bottom), in perspective view. In the following reference is made to FIG. 2.

STEP 1: The basic raw material here is a monocrystalline silicon wafer 2, produced in accordance with the Czochralski-method as it is used, e.g., in the microelectronics or photovoltaics industry. The wafer 2 has a diameter of approximately 76 mm and a thickness of approximately 0.4 mm. The wafer is lightly n- or p-doped, has a specific electrical resistivity of approximately 10 Ohm cm, and its two faces $1a$ and $1b$ are oriented parallel to a <100> crystal plane. One or both faces $1a$ and/or $1b$ of the wafer may be mirror-polished or simply etched and lapped. The wafer 2 can be used straight out of wafer production, or it can be roughly pre-cleaned using conventional methods (e.g., with organic solvents and water, or by plasma oxidation cleaning).

STEP 2: On each face $1a$ and $1b$ of the wafer 2 a thin layer $3a$ and $3b$ of polydiorganolsiloxane (e.g., polydimethylsiloxane, or PDMS; the ensuing discussions refers to PDMS for convenience, but it should be understood that any suitable silicone polymer or copolymer may be employed) is applied and cured (or allowed to cure). The preferred thicknesses of these auxiliary layers $3a$ and $3b$ are between 0.01 mm and 10 mm, with a thickness of between about 0.1 mm and about 1 mm more preferred. The thicknesses of the two layers $3a$, $3b$ are the same in this illustrative embodiment, but in other embodiments the thicknesses of the two layers can differ. For the PDMS it is possible to use, e.g., SYLGARD 184 by Dow Corning, with a mixing ratio of 1:10 between curing agent and base material. The liquid PDMS-mixture is first degassed approximately for one hour in vacuum, then it is applied on each face $1a$, $1b$ of the wafer 2 in the desired thickness, and cured on a hotplate (e.g., for 30 minutes at 100° C.). In this illustrative embodiment PDMS layers $3a$, $3b$ have homogeneous thicknesses over most of the wafer area. This can be achieved by putting the wafer on a horizontal surface and letting the PDMS equilibrate by gravity before curing it. After the PDMS is cured, the three-layer composite (PDMS $3a$—wafer 2—PDMS $3b$) is cooled down to room temperature. After that, any PDMS protruding along the circumference of the wafer 2 is removed with a sharp knife, such that the edge of the wafer 2 is essentially free of PDMS, and PDMS covers only the two faces $1a$ and $1b$ of the wafer 2. It is possible to avoid having any PDMS protrude over the circumference of the wafer (and thus touch the edge of the wafer) by applying the PDMS to the wafer face carefully and letting it equilibrate on a horizontal surface; in this way the surface tension of the PDMS will keep it from overflowing onto the wafer edges.

STEP 3: The composite (PDMS $3a$—wafer 2—PDMS $3b$) is completely immersed in a liquid nitrogen bath (temperature approximately −200° C.). Due to the strongly differing thermal expansion coefficients of silicon (approximately $3*10^{-6}$ $K^{-1}$) and PDMS (approximately $300*10^{-6}$ $K^{-1}$), large mechanical stresses are induced in the composite by this cooling. After the PDMS layers $3a$, $3b$ have substantially reached thermal equilibrium with the surrounding liquid nitrogen bath (e.g., when the intensive "bubbling" in the liquid nitrogen around the PDMS layers $3a$, $3b$ ceases), the composite is taken out of the bath again, exposed to room temperature, and allowed to warm up for a very short time. This warm up time is preferably chosen short enough that at least some parts of the PDMS layers $3a$ and $3b$ still are at temperatures below the glass transition temperature of PDMS (−125° C.), and long enough that at least some parts of the PDMS layers $3a$, $3b$ achieve temperatures above the glass transition temperature of PDMS. For example, a preferred warm up time is between 1 and 5 seconds for 0.4 mm thick layers of PDMS. This leads to non-homogeneous physical conditions inside the auxiliary layer, i.e., the temperature distribution inside the PDMS layers $3a$ and $3b$ is non-homogeneous, with temperatures ranging from approximately room temperature down to approximately −200° C. Since the glass transition temperature of PDMS is approximately −125° C., and since PDMS becomes relatively stiffer (i.e., larger elastic modulus) at temperatures below the glass transition temperature, this results in the PDMS layers $3a$ and $3b$ being stiffer (i.e., larger elastic modulus) towards their interfaces with the wafer 2 and softer (smaller elastic modulus) on their outside.

STEP 4: After the short warm up time, the wafer 2 is hit e.g. with a sharp pointed hammer (peening) at a specific location in the side of the wafer 2, i.e., at a point along its edge, which is not covered by the PDMS layers $3a$ and $3b$. This leads to a locally weak zone or defect in the wafer 2, which in turn triggers a fracture process: The wafer 2 splits spontaneously, in a substantially single, uninterrupted crack propagation movement, parallel to its surface $1a$, into two thin, monocrystalline silicon disks 5, with one side of each disk 5 still having the corresponding PDMS auxiliary layer $3a$ or $3b$ adhering.

With adequate care, each of the two silicon disks 5 consists essentially of one single piece. In order to avoid additional breaking perpendicular to the surface 4, the disks 5 may—directly after the splitting—be transferred onto a 100° C. hotplate (with the side having the PDMS auxiliary layer $3a$ or $3b$ adhered facing down), until the whole PDMS auxiliary layer has warmed up again at least to room temperature. Whatever warming procedure is employed, it is preferred that the disks 5 are carefully pressed against a flat support as they warm so that any curling of the layers is reversed, to flatten the layers as the warming proceeds.

The thin silicon disks 5 produced according to this method consist substantially of monocrystalline silicon with the same properties as the original wafer 2 and can be directly used. Alternatively, the PDMS auxiliary layers $3a$ or $3b$ can also be removed from the silicon disks 5, for example by immersion in an appropriate liquid etchant (e.g., a 3:1 mixture by volume of NMP (N-methylpyrrolidone) and TBAF/THF (tetrabutylammoniumfluoride, 1.0M solution in tetrahydrofuran), or also by immersion in hydrofluoric acid). A preferred way for removing the PDMS auxiliary layers $3a$ or $3b$ is by rinsing with, or immersion in a bath of, hot sulfuric acid ($H_2SO_4$) etchant, preferably at a temperature above 150° C. (and more preferably above 200° C.), then removing the produced white silica foam mechanically (e.g., using a brush, and possibly several brushing-etching cycles), and finally cleaning the silicon disk 5 by immersion in hydrofluoric acid.

In a second illustrative embodiment, the fracture initiation step (STEP 4) is performed while the composite (PDMS $3a$—wafer 2—PDMS $3b$) is still immersed in the liquid nitrogen bath, i.e., during cooling down or after thermal equilibrium with the surrounding liquid nitrogen bath has been reached. In this embodiment, the short intermediate warm up time is omitted.

In a third illustrative embodiment, the warm up time in STEP 3 may be extended, such that the thermally induced stresses are no longer large enough for fracturing to start when hitting the wafer 2 with a sharp pointed hammer during STEP 4. In this case, after STEP 4 has been performed (without fracture occurring), the composite (PDMS 3a—wafer 2—PDMS 3b) is again cooled down by immersing into the liquid nitrogen bath, which then leads to spontaneous start of the fracturing process.

In a fourth illustrative embodiment, in addition or instead of creating a locally weak zone or defect in the wafer 2 during STEP 4, external stress is applied at certain locations on the outside of the composite (PDMS 3a—wafer 2—PDMS 3b), which then triggers the fracture (spalling) process by locally increasing stress intensity above the fracture toughness threshold of the wafer material.

In a fifth illustrative embodiment, a locally weak zone or defect in the wafer 2 is created before the cooling step (STEP 3). In this embodiment, this creating of a weak zone does not trigger the fracture process, but allows to define a location where fracture will preferably start once sufficient stress has been built up in the wafer 2 by cooling it down in STEP 3 (fracturing will then start spontaneously in this case, but may also be additionally triggered using any of the above methods).

In a sixth embodiment, instead of having a PDMS layer 3a with a CTE differing substantially from the CTE of the wafer 2 and subjecting the composite structure to a temperature change, it is also possible to employ other mechanisms to create pre-definable stress patterns in the PDMS layer 3a that can induce the required stress pattern in the wafer 2. One such alternative method is to include piezo-electric actuators at certain positions in the PDMS layer 3a and electrically actuate them to generate a stress pattern in the PDMS layer 3a. More generally, locally definable stress patterns can be produced by embedding, into the PDMS layer 3a, patterns of different materials that undergo different volume changes when activated by a chemical or physical mechanism. Mechanisms that can achieve such a volume change include, in addition to temperature change, a change in humidity (e.g., swelling, de-hydration), a change of solvent composition and/or ionic strength (e.g., osmotic pressure actuators, polyelectrolyte gels, ionic polymer metal composites, conducting polymers, carbon nanotube actuators), a change of pH, phase changes (e.g., freezing of embedded solvent, crystallization, vaporizing), chemical reactions (e.g., polymer gels), electric activation (e.g., piezoelectric or electrostrictive materials, electrostatic actuators, electro-active polymers), magnetic activation (e.g., "magnetic" gels), optical activation (e.g., liquid crystal elastomers, photo-reactive materials), etc, as well as combinations of any or all of those. Also, instead of locally embedding different materials into the PDMS layer 3a it is possible to locally modify the PDMS itself (chemically) in order to achieve the desired locally different volume changing behavior, e.g., by locally adding different functional side chains to the polymer, or locally changing the degree of cross-linking e.g., by UV irradiation.

In a seventh embodiment, the present method is used on a wafer 2 that has existing surface structures on at least one of its two faces 1a or 1b. Such existing surface structures (such as trenches, mesas, membranes, cantilevers, pyramids, etc.) can be formed from the wafer material itself, or they can involve additional materials (e.g., metallic contacts, anti-reflection layers, dielectric layers, epitaxial layers, etc.), or any combination thereof. The PDMS is then applied over these existing structures, covering and conformally surrounding them, so that after curing the PDMS these existing structures become partially embedded in the PDMS layers 3a and/or 3b. When the wafer 2 is split into two thin disks 5, these existing surface structures are preserved on the side of each disk 5 that still has the corresponding PDMS auxiliary layer 3a or 3b adhering thereto. In this way thin, free-standing layers can be produced with complex surface structures on one side (possibly involving additional materials, and even providing complete functional devices such as electronic, optical, chemical, or micro-mechanical devices).

In an eighth embodiment, the present method is used on a wafer 2 that has existing internal (bulk) structures, such as, e.g., one or more dopant gradients. When the wafer 2 is split into two thin disks 5, these existing internal structures are preserved in the corresponding thin disks 5. In this way thin, free-standing layers can be produced that have internal (bulk) structures such as dopant gradients.

In a ninth embodiment, combining aspects from the previous two embodiments, the present method is used on a wafer 2 that has both existing surface structures and existing internal (bulk) structures. In particular, the wafer has partially or completely functional devices (electronic, optical, micro-mechanical, chemical, etc.) on one or both of its faces 1a and/or 1b. Such devices may include LEDs, laser diodes, solar cells, tandem solar cells, power amplifiers, integrated circuits in general, micro-electromechanical devices such as sensors or actuators, etc. The PDMS is then applied over these existing devices on the wafer faces, covering the devices, and conformally surrounding them on the outside, so that after curing the PDMS these existing devices become partially embedded in the PDMS layers 3a and/or 3b. When the wafer 2 is split into two thin disks 5, these existing devices are preserved on the side of each disk 5 that still has the corresponding PDMS auxiliary layer (3a or 3b, respectively) adhering. In this way thin, free-standing layers can be produced that have complex, partially or already completely functional devices on one side.

As an illustrative example for an application of the previous embodiment, the surface structures and internal structures that make up the front part of a conventional silicon solar cell (e.g., front-side doped layer including pn-junction, front metal contact grid, anti-reflective coating) are considered and in the following referred to as "front-structures." Now, instead of producing these "front-structures" only on one side of a wafer as is conventionally done, such "front-structures" are manufactured onto both sides 1a and 1b of a thick monocrystalline silicon wafer 2. Then this wafer 2 is split into two thinner disks 5 as described above, whereby the device layers are preserved, such that each of these two disks 5 now has "front-structures" but only on one side (i.e., the side still having the corresponding PDMS layer 3a or 3b adhered). On the other side of each of the two disks 5 is a "fresh" surface consisting of bulk wafer material. The "fresh" surfaces of both disks can now be further processed using conventional methods for making the back sides of silicon solar cells (e.g., back-surface field doping, back-side contact metallization, etc.), completing the manufacturing of two silicon solar cells. This example shows a number of advantages: most of the solar cell manufacturing steps can be done on a relatively thick (and therefore less fragile) wafer 2, which facilitates use of inexpensive processes such as screen-printing of the contacts, and simplifies wafer handling in general. Also, the same (front-side) dopant can be diffused into the whole surface of the wafer, i.e., into both its sides 1a and 1b, and there is no need, for example, to subsequently remove the dopant from the back of the wafer (since that is automatically achieved by the splitting process). The same holds for, e.g., an anti-reflection coating, which can also be produced on the whole wafer (e.g., oxidative growth of $SiO_2$ and/or PECVD deposition of $Si_3N_4$ nitride) and then automatically is confined to one side through the splitting process. In this way a number of processing steps for solar cell manufacturing can be eliminated or simplified by application of the present method. These benefits are particularly pronounced in another illustrative example, where, instead of a standard solar cell with front and rear contacts, a back-contact solar cell is manufactured: here, almost all of the functional structures are on one side of the cell (the back-side). If such back-side structures are manufactured onto both faces 1a and 1b of a thick mono-crystalline silicon wafer 2, then, after the splitting using the present method, both of the produced thin disks 5 become almost-finished back-contact cells already (possibly only requiring deposition of an anti-reflection coating on the other side). Therefore, the present method can be applied to produce thin, mono-crystalline silicon back-contact solar cells without the need for handling thin wafers through most of the process.

In another aspect, the invention relates to a device comprising a slab (block, ingot, disk, etc.) of a solid state material divided by a gap into two pieces, one piece being the geometrical complement of the other piece, so that by reducing the gap to zero, the shape, dimensions and mass of the original slab can be retrieved, substantially without any material missing (e.g., internal voids, etc.). At least one of those two pieces is a thin layer, i.e., it is substantially a flat or curved sheet having an area of at least 1 $cm^2$, and throughout this area its thickness is smaller than 2 mm, preferably smaller than 0.5 mm. At least one of the thin-layer pieces itself has a layer of at least one additional solid state material (auxiliary layer) with locally varying material properties (e.g., locally varying elastic modulus) adhered to it on the face opposite to the gap. For each of the two pieces, those surfaces facing the gap do not contain materials other than the ones that are found in the bulk of the slab (except possibly for, e.g., a native oxide layer if the surfaces are reactive with and exposed to air).

The approach of the present invention can also be used to produce thin, free-standing layers from work pieces that consist of solid state materials other than monocrystalline silicon (e.g., polycrystalline silicon, sapphire, germanium, quartz, zinc oxide, or amorphous materials such as glass). Also, this approach can be used with work pieces that are composed of several different materials (homogeneous or inhomogeneous composite materials, etc.) or that have an internal structure (laminates, etc.). Furthermore, for the auxiliary layers that are applied onto the work piece, materials other than PDMS— e.g., other polysiloxanes (which can include organometallic groups for, e.g., electric activity), other elastomers, other polymers or plastics in general, or metals such as aluminum or silver, etc.—may be used. It is also possible to utilize auxiliary layers that are composed of several different materials (homogeneous or inhomogeneous composite materials, etc.) or that have an internal structure (laminates, etc.). In general, the work piece is a relatively brittle solid state material. Good adhesion between work piece and auxiliary layer should be achieved and maintained throughout the process, and the auxiliary layer should be amenable to convenient processes for imposing sufficiently strong stress patterns without breaking the auxiliary layer itself.

Also, the PDMS (or other polymer) in the auxiliary layer can be cured (i.e., its polymer chains cross-linked) by means other than heating it on a hotplate. For example, it may be heated by blowing a hot gas over it, or irradiating it with, e.g., infrared light. Alternatively or in addition, curing may be accomplished using chemical additives, ultraviolet radiation, or electron beam. The PDMS (or other polymer, or in general any material in the auxiliary layer) may also be chemically modified to facilitate a particular form of cure (or, in general, solidifying, possibly generating internal stress inside the layer during solidification already), for example, curing PDMS by UV irradiation may be facilitated, e.g., by immersing the PDMS in benzophenone (a photosensitizer that generates radicals under irradiation), or by, e.g., replacing the methyl groups in the PDMS with photoreactive substituents.

Similarly, a number of alternative methods may be used to remove the auxiliary layer from the disks 5 at the end of the process. Instead of, or in addition to chemically etching away the auxiliary layer as described above, the layer may also be removed mechanically, by irradiation, electron beam, and/or heat. For example, a PDMS auxiliary layer can be mechanically split off from a thin disk 5 if the face of the disk opposite to the PDMS layer is temporarily fixed (e.g., glued) to a support, and then, e.g., starting from a corner, the PDMS is slowly and carefully split off by pulling it in a direction substantially vertical to the surface of the disk. Alternatively, PDMS (or other polymers) may simply be heated up, e.g., with a laser or in an oven, above its decomposition temperature (i.e., removal by ashing). It may also be removed by ashing in a plasma, e.g., in an oxygen plasma. The PDMS may also be chemically modified such that it decomposes more easily, e.g., under UV irradiation or when exposed to heat. Finally, any or all of these approaches may be combined (and straightforwardly adapted if materials other than PDMS are used for the auxiliary layer).

The present approach can be applied to work pieces of almost arbitrary shape and is not limited to planar wafers. (In particular, the present invention can be used, e.g., to split off thin sheets directly from a mono-crystalline silicon ingot that is flattened on one side.) To split off a flat sheet it is sufficient that the work piece used is confined by at least one flat surface. On this interface the auxiliary layer is then applied. It is possible to only split off one sheet, or several sheets can be split off from different interfaces of a work piece at the same time. Finally, the present approach can also be applied for producing thin, free-standing curved sheets or shells. To this end, the auxiliary layer is applied onto a correspondingly curved surface of the work piece. The temperature change (or other stress-inducing process) then leads to the splitting off of a thin, correspondingly curved sheet or shell from the remainder of the work piece along a patterned fracture zone inside the work piece. This patterned fracture zone runs everywhere approximately at the same distance to the interface between work piece and auxiliary layer, so that the produced sheet with surface structure patterns has an approximately uniform thickness.

The surface properties of the interface onto which the auxiliary layer is applied are not critical. The interface may be smoothly polished, or it may have significant roughness. It is only important to retain adequate adhesion to the auxiliary layer. In particular, the fracture surface, which is formed on the remainder of the work piece when splitting off a sheet from the work piece, can be used subsequently as the interface onto which the auxiliary layer is applied. Thus the present approach can be re-applied on the remainder of the work piece. In this way sheet after sheet can be successively split off from a single work piece.

Also, from a split-off thin, free-standing layer, further (thinner) layers can be split off by repeating the same steps. For example, using the present method, a monocrystalline silicon wafer can be split into two disks by applying PDMS auxiliary layers onto both sides. Each of these two thinner disks can then again be provided on both sides with a PDMS auxiliary layer, and, repeating the steps of the method, can thus be further split into two even thinner disks, and so on. In this way, a large number of thin monocrystalline disks can be obtained from a single monocrystalline silicon wafer. For example, in three steps, eight approximately 50 micrometer thick disks can be obtained from a customary 0.4 mm thick wafer.

In general, the dimensions of the thus-produced thin, free-standing layers, in particular their thicknesses, can be set through appropriate choice of the stress inducing mechanism (e.g., the temperature change), and/or the properties of the auxiliary layer. This is achieved in particular through appropriate choice of the time flow of the stress induction, the magnitude of the stress induced, the dimensions of the auxiliary layer, the geometric shape of the auxiliary layer, and/or the local mechanical and/or local thermal/chemical/hydrostatic/piezoelectric/etc properties of the auxiliary layer.

The auxiliary layer can, e.g., be applied in liquid or gaseous state onto the corresponding interface of the work piece, and then be solidified there. Alternatively, the auxiliary layer can also be adhered directly in the solid state onto the interface. The adhesion between auxiliary layer and interface can be achieved through chemical bonding, van-der-Waals forces, or other strong adhesive forces. Also an adhesion through alloying of auxiliary layer and work piece material at the interface, or adhering the auxiliary layer by means of a third material (e.g., an adhesive) onto the interface of the work piece, are possible for the implementation of the present method.

Finally, instead of liquid nitrogen, other coolants (e.g., liquid helium, ice water, or cooling solids or cooling gases, etc.) may be used to build up, by cooling, the necessary mechanical stresses inside the auxiliary-layer-work-piece composite. In certain cases it is sufficient to simply cool down the composite from a higher temperature to room temperature, so that a special coolant will not be needed. Furthermore, it is possible in certain cases to achieve the necessary mechanical stresses inside the composite by warming up instead of cooling down. Essential for building up the necessary mechanical stresses at a certain temperature T are a sufficiently large difference in thermal expansion between work piece and at least parts of the auxiliary layer, as well as a sufficiently large difference between the temperature T and the temperature at which the auxiliary layer was adhered onto the work piece.

In accordance with this independent embodiment of the present invention, the production of thin, free-standing layers of solid state materials by stress-induced splitting (spalling) from a work piece is improved by providing a method that enables the use of a stress inducing auxiliary layer comprising inexpensive and little-contaminating materials such as polymers. Embodiments of the invention provide a simple and inexpensive process that reduces the above-identified difficulties for using such materials.

In various embodiments thin, free-standing layers of solid state materials are produced by using mechanical stresses that are induced by physical or chemical changes (e.g., temperature changes) in mutually adhering solid bodies having different material properties, e.g., different coefficient of thermal expansion (CTE). To this end, in addition to a work piece consisting of a solid state material (which preferably has an elastic modulus greater than 100 MPa, more preferably greater than 1 GPa), another solid material is used, whose physical dimensions (e.g. its volume) change—when it is subjected to a certain sequence of physical changes such as temperature changes and/or external pressure changes—in a way that is substantially different from the corresponding changes in the work piece when the work piece is subjected to the same sequence of physical changes (for example, a solid material whose thermal expansion substantially differs from the thermal expansion of the work piece), and which can be joined to the work piece through strong adhesion. One layer of this additional material (in the following referred to as "auxiliary layer") is adhered onto a surface of the work piece. The composite structure consisting of work piece and auxiliary layer is then subjected to a sequence of physical changes such as temperature changes and/or external pressure changes. Under appropriate conditions the mechanical stresses that are thus induced in the composite structure lead to the splitting-off ("spalling") of a thin layer from the work piece, substantially in parallel to the interface between work piece and auxiliary layer. The area of the split-off thin layer of solid state material approximately matches the area of the auxiliary layer. Each of the two surfaces formed when the thin layer is split off from the workpiece can be used again, i.e., another auxiliary layer may be applied to the newly exposed face of the workpiece or to the newly exposed face of the split-off layer. Thus, embodiments of the present invention facilitate repeated split-off operations, both from the remainder of the work piece and from a split-off layer, creating further (and thinner) layers. Also, for some examples of work pieces (e.g., work pieces that substantially consist of a thin sheet, for example, a wafer) it may be beneficial to form auxiliary layers on two or more (possibly opposing) faces of the work piece of solid state material, e.g. in order to enhance stability and avoid shattering of the remainder of the work piece.

For example, if one or more changes in temperature are used in order to induce the required mechanical stresses then the absolute difference in CTE between the work piece and the auxiliary layer is greater than $5*10\text{-}6$ K$-1$ at room temperature, preferably greater than $50*10\text{-}6$ K$-1$ at room temperature, more preferably greater than $100*10\text{-}6$ K$-1$ at room temperature, and most preferably greater than $200*10\text{-}6$ K$-1$ at room temperature. Relatively small absolute differences in CTE may be used if both the work piece and the auxiliary layer can sustain large absolute changes in temperature (e.g., plus or minus 400° C. or more) without melting or decomposing or stopping to adhere to each other, however, larger absolute differences in CTE are preferable (for example, since using higher temperatures may increase the risk of cross-contamination by diffusion). For example, the work piece may consist of silicon with a CTE of approximately $3*10\text{-}6$ K$-1$ at room temperature, and the auxiliary layer may comprise a polymer characterized by a CTE that is greater than about $10*10\text{-}6$ K$-1$ at room temperature. Preferably, the polymer is characterized by a CTE that is greater than about $50*10\text{-}6$ K$-1$ at room temperature, and more preferably, the polymer is characterized by a CTE that is greater than about $200*10\text{-}6$ K$-1$ at room temperature. For example, the auxiliary layer may consist of cross-linked polydimethylsiloxane (PDMS), having a CTE of approximately $300*10\text{-}6$ K$-1$ at room temperature.

In various embodiments of the present invention, a method is provided that enables the use of a stress inducing auxiliary layer comprising inexpensive and little-contaminating materials such as polymers, in particular the use of materials that, under normal conditions, have a relatively small elastic modulus (e.g., smaller than 100 MPa, possibly smaller than 10 MPa, or even smaller than 1 MPa) and/or small fracture toughness (e.g., smaller than 5 MPa m$^{1/2}$, possibly smaller than 2 MPa m$^{1/2}$, or even smaller than 1 MPa m$^{1/2}$).

In one example, a heterogeneous auxiliary layer may be used that comprises different materials, where one material has a relatively large elastic modulus but not necessarily a large fracture toughness, and another material has a relatively large fracture toughness but not necessarily a large elastic modulus. More precisely, the heterogeneous layer comprises different materials, where at least one material has a relatively large elastic modulus, i.e., an elastic modulus greater than 10 MPa, preferably greater than 100 Mpa, and more preferably greater than 1 Gpa, and where at least one material has a relatively large fracture toughness, i.e., a fracture toughness greater than 1/10 of the fracture toughness of the work piece material, preferably greater than the fracture toughness of the work piece material, and more preferable greater than 10 times the fracture toughness of the work piece material, and where at least one material has the property that—when it is subjected to a certain sequence of physical changes such as temperature changes and/or external pressure changes—its physical dimensions (e.g. its volume) change substantially different from the corresponding changes in the work piece material when the work piece is subjected to the same sequence of physical changes (for example, a material whose CTE differs from the CTE of the work piece by at least 5*10-6 K−1 at room temperature, preferably more than 50*10-6 K−1 at room temperature, more preferably more than 100*10-6 K−1 at room temperature, and most preferably more than 200*10-6 K−1 at room temperature), and where no single material has all those three properties (i.e., large elastic modulus, large fracture toughness, and physical dimension change substantially different from the work piece). The relative concentrations of the different materials in the heterogeneous auxiliary layer may for example also depend on the position within the auxiliary layer, e.g., closer to the interface with the work piece of solid state material the concentration of the material having large elastic modulus may be higher. For example, a heterogeneous auxiliary layer may be created by mixing small (possibly nanoporous) silica particles into liquid PDMS, spreading this mixture over a surface of the work piece, and then curing (cross-linking) it, e.g. by heat. In this example, at room temperature, the PDMS has a shear modulus between approximately 100 kPa and 3 MPa and a fracture toughness between 0.03 and 4 MPa m$^{1/2}$. The silica particles have diameters preferably between 0.5 and 10 micrometers, shear modulus between approximately 20 and 40 GPa and a fracture toughness between 0.1 and 1 MPa m$^{1/2}$, all at room temperature. The concentration of silica particles in PDMS is between 1% and 80% by weight, preferably between 10% and 30% by weight. In another example, silica particles may be preferably located close to the interface between auxiliary layer and work piece, i.e., their concentration in the PDMS matrix is highest close to the interface and lower (or zero) in other parts of the auxiliary layer.

In another example, different formulations of the same material may be used in different parts of the auxiliary layer, for example, different polymer chain lengths are used depending on the position within the auxiliary layer. In yet another example, different degrees of cross-linking of polymer chains may be used, depending on the position within the auxiliary layer (a locally higher degree of cross-linking may be used to locally increase the glass transition temperature, i.e., to make the material stiffer at predefineable locations within the auxiliary layer). Predefineable patterns of areas with locally differing degree of cross-linking may e.g. be created through selective irradiation with a UV light source, e.g. through a mask or by directing a UV laser beam over the desired areas, in particular when using photocurable polymers.

In another example, a material in the auxiliary layer may be locally converted into another material having a different elastic modulus and/or fracture toughness, for example by irradiation, heat, pressure, or chemical reaction. For example, parts or all of the surface of an auxiliary layer substantially comprising PDMS are exposed to, e.g., UV irradiation, ozone treatment, or plasma oxidation. Under appropriate conditions this leads—substantially at those locations that were exposed—to the formation of a glassy surface layer in the auxiliary layer (e.g., due to the conversion of —$CH_3$ groups to —OH terminal group functionalities), and this locally defined glassy surface layer has more glass-like properties, i.e., it is stiffer (larger elastic modulus) and than the other parts of the auxiliary layer.

In another example, a homogeneous auxiliary layer substantially comprising a single material may be used. In this example physical conditions are provided such that relevant properties of this material such as fracture toughness and/or elastic modulus vary depending on the position within the auxiliary layer. For example, polymers often are relatively brittle (i.e., small fracture toughness, e.g. smaller than 1 MPa m$^{1/2}$) with comparably large elastic modulus (i.e., "stiffer", e.g. having a shear modulus greater than 100 MPa, or even greater than 1 GPa) at temperatures below their glass transition temperature, and are more ductile (i.e., with large fracture toughness, e.g. larger than 1 MPa m$^{1/2}$) but with comparably small elastic modulus (i.e., "softer", e.g. having a shear modulus smaller than 100 MPa, or even smaller than 10 MPa) at temperatures above their glass transition temperature. By setting up a pre-defined temperature distribution profile (e.g. a temperature gradient) inside an auxiliary layer comprising such a polymer, with the glass transition temperature of the polymer being between the minimum and the maximum temperature in this temperature distribution, then at certain pre-defineable locations inside the auxiliary layer the material of the auxiliary layer becomes more ductile and/or "softer", whereas at other pre-defineable locations it becomes relatively more brittle and/or "stiffer". For example, keeping the interface between the work piece and the adhering auxiliary layer at a temperature below the glass transition temperature of the polymer comprising the auxiliary layer, while keeping the opposite ("free") face of the auxiliary layer at a temperature above the glass transition temperature, results in a temperature gradient across the auxiliary layer. In this example, this leads to parts of the auxiliary layer close to the interface being more brittle and/or "stiffer", and parts of the auxiliary layer close to its "free" face being more ductile and/or "softer".

In a similar example, non-homogeneous physical conditions inside the auxiliary layer may be used to induce locally varying material properties for the auxiliary layer material, e.g. by creating a predefined pattern of temperature distributions inside the auxiliary layer. In this example, more complex temperature distributions than simple temperature gradients are used, which may be created, for example, by using an auxiliary layer material with a relatively low thermal conductivity and subjecting it to a temporal pattern of temperature changes. For example, by keeping one side of the auxiliary layer at a temperature below the glass transition temperature (Tg) of the auxiliary layer material, and changing the temperature applied at the opposite side of the auxiliary layer from a temperature below Tg to a temperature above Tg and back again to a temperature below Tg (using an appropriate temperature change rate that depends, e.g., on the thermal conductivity and heat capacity of the material), it is possible to achieve a temperature distribution with a maximum above Tg inside the auxiliary layer and temperatures below Tg on the outside. In this way it is possible, for example, to create an auxiliary layer that is relatively ductile and "soft" inside and "stiffer" (and possibly more brittle) in its outer parts. In this example the temperature distribution inside the auxiliary layer is not stable over time, and thus it may be preferable to initiate the splitting-off of the thin layer exactly at a certain predefined moment in time, e.g. using the dynamic splitting initiation described further below.

For example, in an auxiliary layer substantially comprising PDMS (with a thermal conductivity of approximately 0.15 W $m^{-1}$ $K^{-1}$ and a glass transition temperature Tg of approximately −125° C.), a temperature distribution having a maximum above Tg inside the auxiliary layer and temperatures below Tg on the outside may be achieved, for example, by letting the auxiliary layer reach thermal equilibrium (e.g. at room temperature), and then cooling the outside of the auxiliary layer to a temperature of approximately −200° C. (e.g., by placing the outside surfaces of the auxiliary layer into thermal contact with a liquid nitrogen bath) for a few seconds (e.g., 2 seconds for a layer of approximately 0.5 mm thickness). Due to the relatively low thermal conductivity of the PDMS, in this way a temperature distribution with a maximum above Tg inside the auxiliary layer and temperatures below Tg on the outside is achieved, resulting in an auxiliary layer that is relatively ductile and "soft" inside and "stiffer" in its outer parts. In some examples, thermal contact between the auxiliary layer surface and the liquid nitrogen (or any other cold reservoir) may be enhanced, e.g., by immersing the auxiliary layer in a cooled Isopentane bath (for temperatures between approximately −160° C. and 0° C.) instead of placing it into direct thermal contact with liquid nitrogen.

In another example, different temperatures (possibly also changing over time) may be applied at different locations on the auxiliary layer.

In another example, physical parameters other than temperature may be used to create and control non-homogeneous physical conditions inside the auxiliary layer that induce locally varying material properties for the auxiliary layer material. For example, locally applying mechanical pressure locally increases the glass transition temperature Tg of certain materials (and, for some materials, locally increases the shear modulus and/or decreases the fracture toughness). Or, in another example, subjecting a certain auxiliary layer material such as, for example, PDMS, to spatially and/or temporally varying patterns of high-frequency (e.g., 100 MHz) mechanical vibrations (i.e., acoustic waves) locally induces transitions from rubber- to glassy-like consistency, i.e., locally increases both the glass transition temperature and the shear modulus of the auxiliary layer material. Also, applying localized sharp shocks to the auxiliary layer material achieves a similar effect for certain materials (for example, compare the well-known example of "Silly Putty" that shatters on impact when hitting it sharply with a hammer but deforms if the same pressure is slowly applied, i.e., under a sharp shock it behaves as if its Tg had been raised). More generally, the well-known fact may be used that often viscoelastic properties of polymers (including the glass transition temperature) have a rate dependence, and thus it may be possible to induce pre-definable spatial and/or temporal patterns of differing viscoelastic properties in the auxiliary layer material by subjecting the material to pre-defined spatial and/or temporal patterns of changes of physical parameters, such as patterns of acoustic waves, patterns of electric or magnetic field changes, patterns of temperature changes, etc. Also, in some of these examples the induced patterns of locally differing material properties inside the auxiliary layer may not be stable over time, and thus it may be preferable to initiate the splitting-off of the thin layer exactly at a certain predefined moment in time, e.g. using the dynamic splitting initiation described further below.

In another example, non-homogeneous physical conditions inside the auxiliary layer that are created using any of the above methods may include creating anisotropic material properties in pre-defined parts of the auxiliary layer. For example, preferentially aligning and/or orienting polymer chains in certain pre-defined parts of an auxiliary layer substantially comprising a polymer results in pre-definable parts of the auxiliary layer having substantially anisotropic elastic modulus. For example, this facilitates fracture (spalling) to start and/or progress more preferentially along certain directions in the work piece rather than along other directions. In another example, an auxiliary layer comprising one or more materials with anisotropic material properties is used for producing thin layers from a work piece that also has anisotropic material properties. For example, a crystalline work piece may be more fragile along certain crystal orientations than along others, leading to undesired vertical cracks in the produced thin layer and possibly even to breakage (shattering). By choosing an auxiliary layer with anisotropic material properties (e.g., anisotropic elastic modulus, or anisotropic CTE) and appropriately orienting this auxiliary layer (with regard to the work piece) the risk of undesired shattering of the work piece or the produced thin layer is reduced in this example. For example, if fracture occurs more easily (i.e., the fracture toughness is smaller) along planes that are oriented in a specific direction (for example, the <111> crystalline plane in monocrystalline silicon), then the risk of such fractures occurring during the production of the thin layer is reduced by using an auxiliary layer whose CTE is anisotropic, and by orienting the direction in which the absolute difference between auxiliary layer CTE and work piece CTE is largest in a direction that is substantially not perpendicular to these planes of easy fracture.

In another example, if the CTE of the auxiliary layer material substantially depends on certain physical conditions such as temperature or applied mechanical pressure, etc. then the CTE may also be locally controlled by setting up non-homogeneous physical conditions in the auxiliary layer.

In another example, the step of inducing predefined patterns of locally differing material properties (such as position dependent viscoelastic properties) in the auxiliary layer material, and the step of setting up a desired stress distribution in the auxiliary layer for splitting-off the thin layer from the work piece, may be combined. For example, for an auxiliary layer material that has a CTE differing substantially from the CTE of the work piece, setting up a non-homogeneous temperature distribution inside the auxiliary layer is used for certain auxiliary layer materials such as PDMS to both create the desired non-homogeneous distribution of material properties (such as non-homogeneous distribution of shear modulus) and at the same time it is used to induce the desired stress distribution in the auxiliary layer and the adhering work piece. Also, if stress is induced through a temperature change it is preferable if the maximum temperature used during the whole process is as low as possible, preferably not higher than 100° C., more preferably not higher than room temperature, in order to reduce the risk of diffusion of contaminants into the thin layer. Therefore, the minimum temperature achieved during the stress inducing temperature change is preferably significantly below 0° C., more preferably below 80° C., and most preferably below 150° C., since a relatively larger temperature change allows to induce larger stress. Therefore, since in this example the temperature change is used to induce stress and at the same time create the desired non-homogeneous distribution of material properties in the auxiliary layer, it is preferable to use an auxiliary layer whose material properties (such as shear modulus) change substantially during the corresponding temperature change, which preferably comprises temperatures below room temperature. For example, for an auxiliary layer substantially comprising a polymer, the glass transition temperature of the polymer is preferably below room temperature, more preferably below 0° C., and most preferably below 100° C. For example, PDMS is preferable as auxiliary layer material in this example since it has a glass transition temperature of approximately −125° C. and its shear modulus changes substantially for temperatures above and below its glass transition temperature.

In another example, it may be desirable (e.g. due to temporally varying material properties in the auxiliary layer, see above) to actively trigger the splitting-off of the thin layer at a specific point in time, i.e., a kind of "dynamic splitting initiation". Since fracture of the work piece of solid state material that is under a certain stress usually starts preferentially at structurally weaker zones or defects in the material, and since once a crack is formed less stress is required to further extend the crack, it is possible to first set up a relatively large amount of stress in a substantially defect-free work piece without any fracture occurring, and then at a desired point in time artificially create a weak zone or defect in the work piece which then leads to immediate start of the fracturing process (i.e., trigger the splitting-off of the thin layer), without requiring to further increase the stress in the work piece. Such weak zones or defects may be created mechanically by delivering a controlled shock to the work piece (e.g., by hitting a certain spot on the work piece with a sharp pointed hammer (peening), thereby locally shattering the crystal structure and creating a dent or nick, or by delivering ultrasonic pulses, or by strong laser pulses, or by sawing, filing, or milling, etc.), chemically (e.g., locally etching a groove), optically (e.g., locally melting the material using a laser, or ablating it to create groove structures), or by other suitable mechanisms. In another example, in addition to or instead of creating defect zones, such mechanisms are also used to locally increase the stress in the work piece at one or more clearly defined locations beyond the fracture threshold, which then also leads to controlled fracture initiation. In yet another example, structurally weaker zones or defects are created artificially in the work piece before stress is induced in the work piece, or while stress is still being built up. With this last example better control of the location on the work piece where the fracturing process will start is achieved. In yet another example, it is preferable to create a weak zone or defect having a pre-defined specific geometry, since, e.g. sharp corners (such as the ones resulting from anisotropic KOH etch in monocrystalline silicon) are known to often have significantly reduced fracture toughness compared to the fracture toughness of the bulk material.

In another example, it is desirable to provide non-homogeneous physical conditions inside the auxiliary layer after the thin layer has been split-off from the work piece (with the auxiliary layer adhering to the thin layer). This facilitates handling and further processing of the thin layer and the adhering auxiliary layer, and reduces the risk of breaking the thin layer after it has been split-off. For example, if cooling is used to induce stress in the composite structure consisting of work piece and adhering auxiliary layer then, after splitting off the thin layer from the work piece, the composite structure consisting of thin layer and adhering auxiliary layer is still under internal stress, and in some examples it is preferable to warm up this composite (thin layer—auxiliary layer) in order to reduce this stress before further processing occurs. However, during this warming up step, in some examples, it is preferable to provide appropriate non-homogeneous physical conditions inside the auxiliary layer: For example, if the auxiliary layer comprises a polymer that has a CTE substantially larger than the CTE of the thin layer and if that polymer is—before warming starts—at a temperature below or substantially close to its glass transition temperature, then during warming up the polymer expands substantially (much more than the thin layer), and for certain polymers such as PDMS the stiffness (i.e., the elastic modulus) of the polymer decreases substantially. Therefore, in this example, if warming occurs preferentially in parts of the auxiliary layer that are close to the interface between auxiliary layer and thin layer, while parts of the auxiliary layer that are further away from this interface remain cooler, then the parts of the auxiliary layer that are close to the interface expand more and become relatively softer (i.e., lower elastic modulus), while parts of the auxiliary layer that are further away from the interface (and cooler) remain more contracted and stiffer. This may lead to excessive bending of the composite (thin layer—auxiliary layer) during warming up, which in turn may lead to breaking (formation of cracks perpendicular to the interface) of the thin layer. On the other hand, if, in this example, warming occurs preferentially in parts of the auxiliary layer that are further away from the interface between auxiliary layer and thin layer, while parts of the auxiliary layer that are closer to this interface remain cooler, then the parts of the auxiliary layer that are further away from the interface expand more and become relatively softer (i.e., lower elastic modulus), while the parts of the auxiliary layer that are close to the interface remain more contracted and stiffer. This second case results in substantially less bending of the composite (thin layer—auxiliary layer), and also substantially reduced risk of breaking the thin layer. A non-homogeneous distribution of temperature (and stiffness) in the auxiliary layer such as the one described in this second case is achieved, for example, by preferentially heating the face of the auxiliary layer opposite to the interface with the thin layer, which is achieved, for example, by placing the composite (thin layer—auxiliary layer) on a hotplate (that is at a temperature of, e.g., 100° C. for an auxiliary layer comprising PDMS) with the auxiliary layer facing down towards the hotplate. In this example, it is preferable to use an auxiliary layer with a relatively low thermal conductivity, such as an auxiliary layer comprising PDMS. In another example, inner parts of the auxiliary layer remain relatively colder, stiffer, and more contracted, while the outer parts of the auxiliary layer expand more and become relatively softer (thereby creating, e.g., an auxiliary layer with a "stiffer core"). This is achieved, for example, by using an auxiliary layer with a relatively low thermal conductivity and strongly heating the outside of the auxiliary layer. Depending on the residual stress in the composite (thin layer—auxiliary layer) after it is split off from the work piece, and on the desired further processing of the thin layer, different examples of such non-homogeneous physical conditions inside the auxiliary layer may be used.

In another example, pre-definable non-homogeneous physical conditions inside the auxiliary layer may be created in order to control the production of locally definable structures on the surface of the produced thin layer of solid state material. For example, it is known that the non-dimensional elastic moduli dependence of bimaterial systems, for traction-prescribed boundary value problems, may be expressed in terms of two bimaterial parameters, Sigma, the stiffness ratio of the two materials, and epsilon, the oscillatory index. It is also known that for a bimaterial system consisting of a work piece of one material and an auxiliary layer of a second material (taking each material to be isotropic and linearly elastic, with a semi-infinite crack pre-existing in the work piece parallel to the interface, and the work piece and the auxiliary layer assumed infinitely long) the steady-state solution for the spalling problem (e.g., the thickness of the produced thin layer) substantially depends on the thickness of the auxiliary layer as well as on the stiffness ratio Sigma, but only weakly on the oscillatory index beta. Therefore, in an example of an embodiment of the present invention, locally defined and relatively large variations in the thickness of the produced thin layer are achieved by locally varying the thickness of the auxiliary layer and/or its stiffness. Also, locally varying the oscillatory index allows to modify the local properties (e.g., period or amplitude) of relatively smaller (in terms of thickness variation, i.e., amplitude), substantially periodic structures that are produced on the surface of the thin layer by oscillatory behavior at the crack tip. For example, an auxiliary layer substantially comprising PDMS (with a thickness preferably between 10 and 5000 micrometers), which is adhering to a work piece consisting of a mono-crystalline silicon wafer (with a thickness preferably between 10 and 5000 micrometers), is locally patterned (for example, by cutting the PDMS surface with a sharp knife, to depths preferably between 1 micrometer and the full thickness of the auxiliary layer). In this way, the local thickness and/or local elastic properties of the auxiliary layer are modified. By subsequent splitting-off (spalling) according to embodiments of the present invention, thin silicon layers (having thicknesses between 10 and 500 micrometers) with locally definable structured surfaces are thus produced. On these thin silicon layers, for example, the produced surface-structure features have lateral dimensions ranging from significantly below one millimeter up to several centimeters. The heights of these features (i.e., the local thickness of the thin layer at the feature) can be controlled from zero (i.e., a correspondingly shaped hole in the thin layer) to above several hundred micrometers, depending also on the lateral dimensions of the feature. Furthermore, each of these "macroscopic" features can be further endowed with a choice of specific "microscopic" surface roughness patterns, where these microscopic patterns consist of or include substantially periodic structures such as lines, valleys, edges, etc. that have vertical and lateral dimensions ranging from below 100 nanometers to above several micrometers, and spatial periods ranging from below 100 nanometers to several tens of micrometers.

In another example, the thickness of the produced thin layer of solid state material may be varied by varying the thickness of the auxiliary layer and/or the elastic modulus of the auxiliary layer. For example, if an auxiliary layer with a relatively small elastic modulus is used, a relatively thick auxiliary layer is needed to induce enough stress in the work piece for splitting off a thin layer of solid state material. Since for a relatively thick auxiliary layer small absolute variations in the thickness of the auxiliary layer (e.g., due to inaccurate production processes, such as random errors in the amount of auxiliary layer material that is being deposited on the work piece, e.g. by spray deposition) amount to comparably small relative thickness variations, the resulting relative thickness variations in the produced thin layer of solid state material is also comparably small (as compared to the case of using a thinner auxiliary layer with a larger elastic modulus). Furthermore, in a similar way, using a relatively thick auxiliary layer (with a correspondingly smaller elastic modulus) also reduces the effects of small areas of unwanted local variation in material properties within the auxiliary layer on the thickness of the produced thin layer. Therefore, in these examples, using an auxiliary layer with a relatively small elastic modulus is preferable in terms of achieving a better control over the thickness of the produced thin layer of solid state material. For example, an auxiliary layer substantially comprising PDMS with a thickness between approximately 0.1 and 1 mm can be used for producing thin layers (having thicknesses between approximately 50 and 300 micrometers) from monocrystalline silicon wafers (having thicknesses between 0.2 and 1 mm), however, an auxiliary layer substantially comprising aluminum requires a thickness between 5 and 100 micrometers for producing the same thin monocrystalline silicon layers. Since for PDMS a much thicker auxiliary layer is used, the process is, in this example, easier to control for PDMS than for aluminum.

Finally, in some examples aspects of any or all of the above examples may be combined.

In particular the present invention is also related to a method for producing thin sheets or disks (wafers) from mono- or polycrystalline semiconductor materials. The present invention is in particular related to all applications, where thin mono- or polycrystalline silicon disks are needed or desirable (e.g., due to cost reasons). Possible applications include the production of cost-effective and efficient mono- or polycrystalline silicon solar cells, as well as mechanically flexible electronic components and circuits. For example, using the present method it is possible to split off approximately 50 micrometer thick disks from a monocrystalline silicon wafer or from a truncated silicon ingot, in parallel to its surface.

A significant advantage of the invention lies therein that the present method significantly reduces the material loss that occurs during the production of thin sheets from materials having low ductility, such as e.g. silicon. In contrast to previous methods such as, e.g., sawing, grinding, polishing, or etching, our method incurs almost no loss of valuable feedstock material. When splitting off the disks, sheets, or shells from the work piece the feedstock gets almost completely distributed to the split-off disks and the remainder of the work piece.

An additional advantage of the invention is that the production of very thin sheets (less than approximately 100 micrometer thickness) is faster and less labor-intensive than with previous methods, such as e.g. grinding and polishing.

Another advantage of the invention is that the present method, compared to previous methods, requires significantly less expensive equipment and less expensive consumable materials for its execution. The present method can very easily be integrated as a substep into existing production methods e.g. for the production of thin silicon wafers or solar cells. The present method provides a simple way for more efficient feedstock utilization than with previous methods. Consequently, the production of a larger number of usable thin disks, sheets, or shells from a work piece of given size becomes possible.

Finally, an advantage of the invention is that the described method can be applied to many different types of work piece materials (e.g., for sapphire which can be used e.g. for manufacturing LEDs, or for germanium which can be used e.g. for manufacturing multi-junction "tandem" solar cells).

Figure 3:
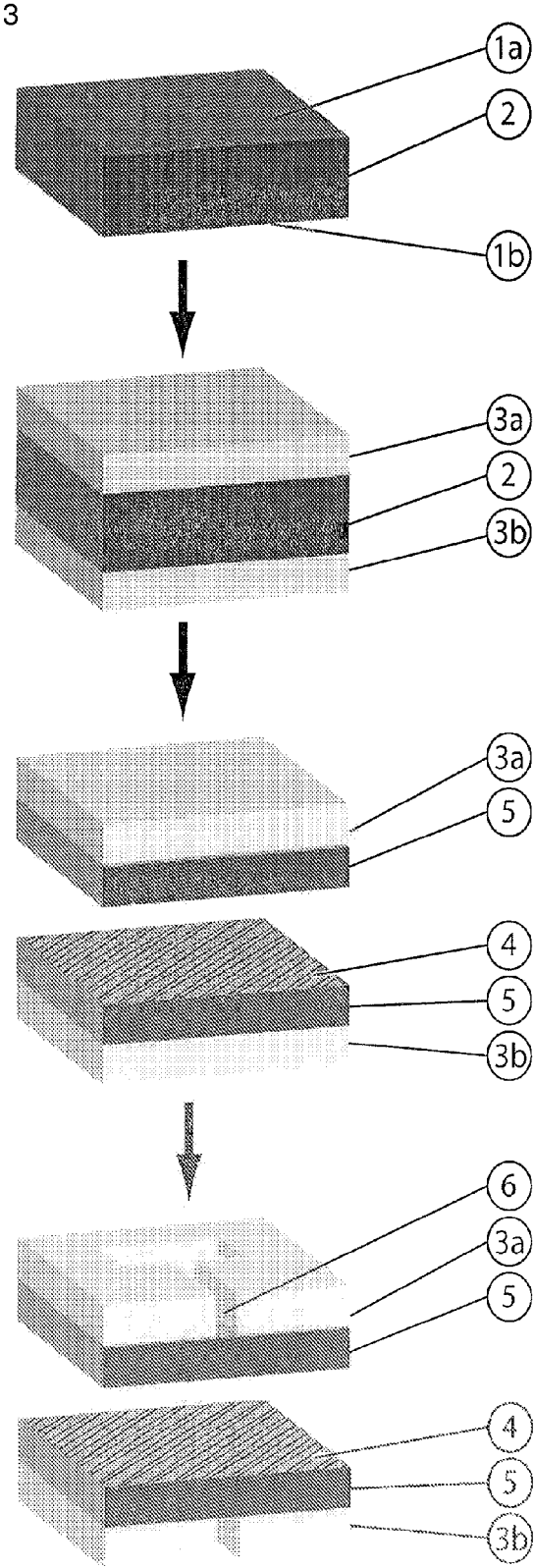
FIG. 3 illustrates schematically the process sequence of the present method in four steps (from top to bottom), in perspective view.

Third Independent Embodiment(FIG. 3)

According to a different aspect of the present invention is related to a independent method for producing thin, free-standing layers of solid state materials with surface structures. The following illustrative embodiments of the invention are described with reference to FIG. 3.

In a first embodiment, the work piece 2 is a commercially available monocrystalline silicon wafer. FIG. 3 presents schematically a representative process sequence in accordance with the invention, in four steps (from top to bottom), in perspective view. In the following reference is made to FIG. 3.

STEP 1: The basic raw material here is a monocrystalline silicon wafer 2, produced in accordance with the Czochralski-method as it is used, e.g., in the microelectronics or photo-voltaics industry. The wafer 2 has a diameter of approximately 76 mm and a thickness of approximately 0.4 mm. The wafer is lightly n- or p-doped, has a specific electrical resistivity of approximately 10 Ohm cm, and its two faces 1a and 1b are oriented parallel to a <100> crystal plane. One or both faces 1a and/or 1b of the wafer may be mirror-polished or simply etched and lapped. The wafer 2 can be used straight out of wafer production, or it can be roughly pre-cleaned using conventional methods (e.g., with organic solvents and water, or by plasma oxidation cleaning).

STEP 2: On each face 1a and 1b of the wafer 2 a thin layer 3a and 3b of polydiorganolsiloxane (e.g., polydimethylsiloxane, or PDMS; the ensuing discussions refers to PDMS for convenience, but it should be understood that any suitable silicone polymer or copolymer may be employed) is applied and cured (or allowed to cure). The preferred thicknesses of these auxiliary layers 3a and 3b are between 0.01 mm and 10 mm, with a thickness of between about 0.3 mm and about 3 mm more preferred. The thicknesses of the two layers 3a, 3b are the same in this illustrative embodiment, but in other embodiments the thicknesses of the two layers can differ. For the PDMS it is possible to use, e.g., SYLGARD 184 by Dow Corning, with a mixing ratio of 1:10 between curing agent and base material. The liquid PDMS-mixture is first degassed approximately for one hour in vacuum, then it is applied on each face 1a, 1b of the wafer 2 in the desired thickness, and cured on a hotplate (e.g., for 30 minutes at 100° C.). In this illustrative embodiment PDMS layers 3a and 3b have homogeneous thicknesses over most of the wafer area. This can be achieved by putting the wafer on a horizontal surface and letting the PDMS equilibrate by gravity before curing it. After the PDMS is cured, the three-layer composite (PDMS 3a—wafer 2—PDMS 3b) is cooled down to room temperature. After that, any PDMS protruding along the circumference of the wafer 2 is removed with a sharp knife, such that the edge of the wafer 2 is essentially free of PDMS, and PDMS covers only the two faces 1a, 1b of the wafer 2. It is possible to avoid having any PDMS protrude over the circumference of the wafer (and thus touch the edge of the wafer) by applying the PDMS to the wafer face carefully and letting it equilibrate on a horizontal surface; in this way the surface tension of the PDMS will keep it from overflowing onto the wafer edges.

STEP 3: Then the composite (PDMS 3a—wafer 2—PDMS 3b) is completely immersed in a liquid nitrogen bath (temperature approximately −200° C.). Due to the strongly differing thermal expansion coefficients of silicon (approximately $3 \times 10^{-6}$ K$^{-1}$) and PDMS (approximately $300 \times 10^{-6}$ K$^{-1}$), large mechanical stresses are induced in the composite by this cooling. After a few seconds of cooling, the wafer 2 splits spontaneously, parallel to its surface 1a, into two thin, monocrystalline silicon disks 5. With adequate care, each of the two silicon disks 5 consists essentially of one single piece, with one side of each disk 5 still having the corresponding PDMS auxiliary layer 3a or 3b adhering. In order to avoid additional breaking perpendicular to the surface 4, the disks 5 may—after the splitting—be transferred directly out of the liquid nitrogen bath onto a 100° C. hotplate (with the side having the PDMS auxiliary layer 3a or 3b adhered facing down), until the whole PDMS auxiliary layer has warmed up again at least to room temperature. Whatever warming procedure is employed, it is preferred that the disks 5 are carefully pressed against a flat support as they warm so that any curling of the layers is reversed, to flatten the layers as the warming proceeds.

STEP 4: Finally, a patterning step is performed on one or both of the PDMS auxiliary layers 3a and/or 3b: A laser beam is used to cut an arbitrary pattern 6 of lines and/or other geometrical figures (such as circles, etc.) into the surface of one or both of the PDMS layers 3a and/or 3b. In this embodiment, all cuts extend completely through the full thickness of the corresponding PDMS layers 3a and/or 3b, i.e., in the "mask openings" the PDMS is locally removed (burned away) completely, revealing the surface of the underlying thin silicon disks 5. The laser preferably has a frequency that is strongly absorbed by PDMS (a $CO_2$ laser meets this criterion), and preferably the intensity and the motion of the beam over the PDMS layers (3a and/or 3b) is controlled in an automated or manual fashion to cut a desired pattern. Commercially available laser cutters (e.g., VERSA LASER VLS 6.60, with 60 Watt $CO_2$ laser) are acceptable.

Features in the pattern 6 that have lateral dimensions greater than about 0.1 mm can be created in the PDMS layers 3a and/or 3b. It is preferable to remove possibly remaining burned PDMS material inside the mask openings 6 by using a liquid cleaning solution such as an etchant, e.g., by rinsing with a solution containing hydrofluoric acid (HF).

The thin silicon disks 5 with adhering patterned masks (auxiliary layers 3a and/or 3b) produced according to this method consist substantially of monocrystalline silicon with the same properties as the original wafer 2. The adhering patterned masks 3a and/or 3b can then be used for creating locally defined structures on the surface of the thin silicon disks 5. Formation of such structures may be achieved using appropriate additive processes where additional materials are formed or deposited through the mask openings 6 on the surface of the thin silicon disks 5, e.g., by physical vapour deposition, ion implantation, local oxidation, chemical vapour deposition, epitaxy, electroplating, or electrophoretic deposition, etc. The structure formation step may also involve subtractive processes where surface structures such as trenches, mesas or pyramids are created through the mask openings 6 by shaping the material at the surface of the thin silicon disk 5 itself, e.g., by dry (e.g., RIE) or wet anisotropic (e.g., KOH) or isotropic (e.g., HF-based) etching.

After the structure formation process, the PDMS auxiliary layers 3a or 3b may optionally be removed from the silicon disks 5, for example by immersion in an appropriate liquid etchant (e.g., a 3:1 mixture by volume of NMP (N-methylpyrrolidone) and TBAF/THF (tetrabutylammoniumfluoride, 1.0M solution in tetrahydrofuran), or also by immersion in hydrofluoric acid). A preferred way for removing the PDMS auxiliary layers 3a or 3b is by rinsing with, or immersion in a bath of, hot sulfuric acid ($H_2SO_4$) etchant, preferably at a temperature above 150° C. (and more preferably above 200° C.), then removing the produced white silica foam mechanically (e.g., using a brush, and possibly several brushing-etching cycles), and finally cleaning the silicon disk 5 by immersion in hydrofluoric acid.

In accordance with embodiments of this independent aspect of the present invention, the production of thin, free-standing layers of solid state materials with surface structures is improved by combining production of the layers with certain process steps for the previously separate production of surface structures, in particular, with process steps relating to deposition and patterning of a mask on the surface of the layers for subsequent formation of locally definable surface structures. Embodiments of the invention provide a simple and inexpensive process that circumvents most of the above-identified disadvantages. Embodiments of the invention can produce thin, free-standing layers of solid state materials with locally definable surface structures that may comprise additional solid state materials.

In various embodiments, thin, free-standing layers of solid state materials are produced by inducing locally controllable stresses in the solid state material. Such stresses are induced by setting up locally controlled stresses in an auxiliary layer that adheres to the solid state material. The auxiliary layer may be joined to a work piece of solid state material through sufficiently strong adhesion. Under appropriate conditions, the mechanical stresses lead to the splitting-off of a thin layer from the work piece, in parallel to the interface between work piece and auxiliary layer, with the auxiliary layer still adhering to the split-off thin layer. The auxiliary layer is then patterned and used as a mask, i.e., the material of the auxiliary layer is selectively removed in certain areas (e.g. by photolithography) in order to form a pattern of mask openings. Through these openings in the auxiliary layer locally definable structures can be formed on the underlying surface of the thin layer of solid state material by a number of well-known techniques, e.g., by physical vapor deposition.

The auxiliary layer itself is prepared in a way that allows locally controlled stresses to be induced. For example, the auxiliary layer may comprise a material with a relatively high coefficient of thermal expansion (CTE). If the auxiliary layer is adhered to a work piece whose CTE is substantially lower, and if the composite structure (auxiliary layer—work piece) is subjected to a temperature change, then large stresses can be induced in the work piece, leading to the splitting-off of a thin layer from the work piece.

For example, the work piece may consist of silicon with a CTE of approximately $3*10^{-6}$ $K^{-1}$ at room temperature, and the auxiliary layer may comprise a polymer characterized by a CTE that is greater than about $10*10^{-6}$ $K^{-1}$ at room temperature. Preferably, the polymer is characterized by a CTE that is greater than about $50*10^{-6}$ $K^{-1}$ at room temperature, and more preferably, the polymer is characterized by a CTE that is greater than about $200*10^{-6}$ $K^{-1}$ at room temperature. In one example, the auxiliary layer consists of cross-linked polydimethylsiloxane (PDMS), having a CTE of approximately $300*10^{-6}$ $K^{-1}$ at room temperature.

In another example, the auxiliary layer may comprise a material (for example, a metal or a plastic) characterized by a CTE that is differing from the CTE of the work piece by an absolute value of at least $10*10^{-6}$ $K^{-1}$ at room temperature, preferably by an absolute value of at least $50*10^{-6}$ $K^{-1}$ at room temperature, more preferably by an absolute value of at least $100*10^{-6}$ $K^{-1}$ at room temperature, and most preferably by an absolute value of at least $200*10^{-6}$ $K^{-1}$ at room temperature. For example, for a work piece of silicon having a CTE of approximately $3*10^{-6}$ $K^{-1}$ at room temperature an auxiliary layer comprising aluminum having a CTE of approximately $24*10^{-6}$ $K^{-1}$ at room temperature can be used.

In yet another example, local material properties other than local CTE may be used to create locally controllable stress patterns in the auxiliary layer, for example local swelling.

Also, in order to create large enough stresses, an auxiliary layer with a relatively large shear modulus is required. Furthermore, the fracture toughness of the auxiliary layer material has to be large enough (compared to the fracture toughness of the work piece material) in order to avoid fracturing the auxiliary layer instead of the work piece. However, in some examples it may be desirable to use a stress inducing auxiliary layer comprising inexpensive and little-contaminating materials such as polymers, in particular materials that, under normal conditions, have a relatively small elastic modulus (e.g., smaller than 100 MPa, possibly smaller than 10 MPa, or even smaller than 1 MPa) and/or small fracture toughness (e.g., smaller than 5 MPa $m^{1/2}$, possibly smaller than 2 MPa $m^{1/2}$, or even smaller than 1 MPa $m^{1/2}$). Therefore, in some examples, a heterogeneous auxiliary layer is used that comprises different materials, where one material has a relatively large elastic modulus but not necessarily a large fracture toughness, and another material has a relatively large fracture toughness but not necessarily a large elastic modulus. In other examples, a homogeneous auxiliary layer substantially comprising a single material is used and physical conditions are provided such that relevant properties of this material such as fracture toughness and/or elastic modulus vary depending on the position within the auxiliary layer (for example, setting up a non-homogeneous temperature distribution in an auxiliary layer whose elastic modulus depends on temperature).

Under appropriate conditions, the induced mechanical stress patterns lead to the splitting off of a thin layer from the work piece, in parallel to the interface between work piece and auxiliary layer.

The area of the split-off thin layer of solid state material approximately matches the area of the auxiliary layer. Each of the two surfaces formed when the thin layer is split off from the workpiece can be used again, i.e., another auxiliary layer may be applied to the newly exposed face of the workpiece or to the newly exposed face of the split-off layer. Thus, embodiments of the present invention facilitate repeated split-off operations, both from the remainder of the work piece and from a split-off layer, creating further (and thinner) layers on which locally definable surface structures can then be formed by using the corresponding adhering auxiliary layers as masks, as will be described in the following paragraphs. Finally, for some examples of work pieces (e.g., work pieces that substantially consist of a thin sheet, for example, a wafer) it may be beneficial to form auxiliary layers on two or more (possibly opposing) faces of the work piece of solid state material, e.g. in order to enhance stability and avoid shattering of the remainder of the work piece.

The auxiliary layer may be used as a mask in many different ways. In one example, the auxiliary layer is adhered to the work piece of solid state material, then stresses are induced and a thin layer of solid state material is split-off together with the auxiliary layer, and finally, a pattern of "mask openings" is cut into the auxiliary layer. In this example, mask openings are areas where the auxiliary layer material is locally removed through the whole thickness of the auxiliary layer revealing the underlying thin layer of solid state material. Mask openings may be cut into the auxiliary layer using any appropriate technology, also depending on the material of the auxiliary layer.

In one example, for an auxiliary layer substantially comprising a polymer, mask openings are cut by irradiating the layer with a laser beam and burning away the polymer material at predefined locations, possibly involving an additional step where the burned material is removed from the remainder of the auxiliary layer by using a liquid cleaning solution such as an etchant. For example, in an auxiliary layer substantially comprising PDMS mask openings can be cut by irradiating with a $CO_2$ laser and then removing the burned material by rinsing with a solution containing hydrofluoric acid (HF).

In another example, a photolithographic method is used, e.g., a photoactive auxiliary layer is "exposed" with the desired pattern (e.g. by selectively irradiating it with the desired pattern of ultraviolet light) and then "developed" (i.e., the exposed or unexposed part of the auxiliary layer is etched away selectively).

Regardless of the method used to cut the mask openings, this process yields a patterned mask on the thin layer of solid state material. This patterned mask is then used for creating locally defined structures on the surface of the thin layer. Formation of such structures may be achieved using appropriate additive processes where additional materials (that may be different from the material of the thin layer) are formed or deposited through the mask openings on the surface of the thin layer, e.g., by physical vapour deposition, ion implantation, local oxidation, chemical vapour deposition, epitaxy, electroplating, or electrophoretic deposition, etc. The structure formation step may also involve subtractive processes where surface structures such as trenches, mesas or pyramids are created through the mask openings by shaping the material at the surface of the thin layer itself, e.g., by dry (e.g., RIE) or wet anisotropic (e.g., KOH in mono-crystalline silicon) or isotropic (e.g., HF-based) etching, etc. For example, aqueous solutions comprising tetramethylammonium hydroxide (TMAH), e.g., at concentrations between 0.1-10% TMAH by weight (preferably between 1-5% TMAH by weight), at temperatures between 40-100° C. (preferably between 70-90° C.) can be used to anisotropically etch mono-crystalline silicon using an auxiliary layer substantially comprising PDMS as mask, since the etch rate of PDMS in such a TMAH-based etchant is very small. Finally, combinations of additive and subtractive processes are also possible for structure formation on the thin layer.

In another example, the auxiliary layer may be used as a mask in a similar way as described above, except that the mask openings are not cut through the whole thickness of the auxiliary layer, but only to a certain depth in the auxiliary layer, starting from the interface between the auxiliary layer and the thin layer of solid state material. In other words, a pattern of tunnels is created within the auxiliary layer, where the floor of these tunnels is provided by the surface of the thin layer of solid state material, and the other walls of these tunnels are provided by the material of the auxiliary layer. These tunnels may be interconnected with other tunnels, and for each—possibly interconnected—system of tunnels at least two openings are provided where the tunnels can be accessed from outside the auxiliary layer-thin layer composite structure. These tunnels may be cut into the auxiliary layer using any appropriate technology, also depending on the material of the auxiliary layer. The preferred dimensions of these tunnels (e.g., height, diameter, length) depend on the desired use of the tunnels as well as on the technology used to create these tunnels.

In one example, for an auxiliary layer comprising a polymer that absorbs light strongly in a part of the electromagnetic spectrum where the solid state material of the thin layer is substantially transparent, such tunnels are cut by irradiation with a laser that has a frequency substantially within that part of the spectrum, in the following way: The laser beam is irradiated at the auxiliary layer from the side where the thin layer of solid state material is adhering, i.e., the laser beam is first transmitted through the thin layer of solid state material before being absorbed in the auxiliary layer. In this way the parts of the auxiliary layer that are closest to the interface between the auxiliary layer and the thin layer of solid state material are burned away first by the laser. In this example it may be preferable to provide means for sufficient venting of combustion products, e.g., by always keeping at least one end of the tunnels open to atmosphere, which can be achieved, for example, by starting to cut the tunnels at the edge of the auxiliary layer-thin layer interface.

In another example of an appropriate technology for cutting such tunnels, a photolithographic method is used, where a two-layer composite auxiliary layer comprising a photoactive "inner" layer adhered to the thin layer of solid state material, and another non-photoactive "outer" layer adhered to the opposite face of the photoactive layer is used. This two-layer composite auxiliary layer is then "exposed" with the desired pattern (e.g. by irradiating it with the desired pattern of ultraviolet light) and then "developed", whereby only selected parts (either exposed or unexposed parts, depending on the photoactive material) of the photoactive layer but substantially no parts of the non-photoactive layer are etched away, allowing to create the desired tunnels.

Regardless of the method used to cut these tunnels, once they are created they are used for creating locally defined structures on the surface of the thin layer of solid state material (on the "floors" of the tunnels). This may be done by additive processes (e.g., by flowing an electroplating or electroless plating liquid through the tunnels), subtractive processes (e.g., by flowing a liquid etchant through the tunnels), and/or combinations of additive and subtractive processes. Flowing liquids through a tunnel is, for example, achieved by providing a supply of liquid at one end of the tunnel and applying a vacuum at the other end (or, more generally, by providing a supply of liquid at some of the outside openings in the network of (possibly interconnected) tunnels and applying vacuum at the remainder of openings).

One advantage of using such tunnels (instead of mask openings through the whole thickness of the auxiliary layer, as described above) is that, in principle, in each tunnel a different structure formation process can be used, which allows simultaneous application of different structure formation processes on the thin layer, using only one single mask (e.g., simultaneous electrodeposition of different metals in different tunnels). In this way, for example, different locally definable surface structures consisting of different materials can be created simultaneously on the same thin layer of solid state material, using only one single mask.

In one example, some of the tunnels on the thin layer are filled with a solution containing an n-dopant (for the thin layer material), and other tunnels on the same thin layer are filled with a solution containing a p-dopant. All tunnels can be filled in parallel, and the dopants are then diffused into the thin layer simultaneously, e.g., by heating the composite structure including auxiliary layer with filled tunnels and the adhering thin layer. In this way, locally definable patterns of both n-doped and p-doped areas on the thin layer can be created in a simple and efficient way. Therefore, using such tunnels may in many cases be faster and more economical than processes using conventional masks, where usually several masks are required to create surface structures consisting of different materials. Furthermore, the thin layer of solid state material with the adhering auxiliary layer containing such tunnels may also be used directly in applications, e.g., as a microfluidic device, for example for sensors or actuators.

In another example, a desired pattern of mask openings (fully or partially through the thickness of the auxiliary layer) is cut into the auxiliary layer before the thin layer of solid state material is split-off from the remainder of the workpiece. In this example, the local dimensions and depths (within the auxiliary layer) of these mask openings affect the local thickness and surface properties of the produced thin layer of solid state material. Under appropriate conditions, on the face of the thin layer that was inside the work piece before splitting-off, a pattern of surface structures is formed, and this pattern is dictated by the pattern of mask openings in the auxiliary layer.

Furthermore, at the same time a pattern of surface structures is formed on the face of the work piece that becomes newly exposed by the splitting-off of the thin layer, and this pattern is substantially the mirror image (more precisely, the three-dimensional complement) of the pattern formed on the surface of the detached layer. In addition to these surface structures that are created by the splitting-off process itself, other locally defined surface structures can be formed on the opposite face of the thin layer of solid state material (where the auxiliary layer is adhering) by using the auxiliary layer as mask (e.g., for deposition of additional materials, or for etching) according to any of the examples described above.

In another example, some or all of the mask openings are not cut through the full thickness of the auxiliary layer initially but only to a certain depth. However, after the splitting-off these mask openings are then extended through the full thickness of the auxiliary layer, e.g. by applying a homogeneous etch process to the whole surface of the auxiliary layer in order to reduce its thickness everywhere, until the mask openings reach through to the surface of the thin layer of solid state material.

In yet another example, a desired pattern of mask openings is imprinted on the auxiliary layer before the thin layer of solid state material is split-off from the remainder of the workpiece, however, without removing any material from the auxiliary layer until after the splitting-off. In one example, a photoactive auxiliary layer is exposed using the desired pattern of mask openings before splitting-off the thin layer of solid state material, but only developed (where some auxiliary layer material is actually removed) after the thin layer is split-off. An advantage of this method is that it allows to perform exposure of the mask (i.e., a step where relatively high precision and good optical alignment may be needed) while the thin layer is still attached to the work piece (which is thicker and thus can be handled more easily), and at the same time allows to significantly reduce the above described, possibly undesired mechanical effects of the pattern of mask openings on the local thickness and surface properties of the produced thin layer of solid state material.

In another example, the auxiliary layer may also be used as a kind of "reservoir" mask: In addition to or instead of the mask uses described above, where mask openings define areas where additional additive and/or subtractive processes subsequently deposit materials onto and/or etch away material from the thin layer of solid state material, the auxiliary layer itself can also provide at least part of the materials that are to be deposited onto the thin layer or that are to be reacted with materials of the thin layer. In one example, the auxiliary layer comprises materials that are used as dopants for the thin layer, and these dopants are diffused ("driven") into the thin layer e.g. by heating the composite structure comprising auxiliary layer and adhering thin layer. Diffusion of dopants may be locally limited to certain areas of the thin layer, for example by heating only selected areas of the composite structure (e.g., by irradiating only certain areas selectively with a laser beam), by including the dopant material predominantly in certain areas in the auxiliary layer, or by cutting away selected parts of the auxiliary layer (e.g., by any of the methods described above for creating mask openings) before diffusing the dopant.

Instead of or in addition to dopants, the auxiliary layer may comprise other materials (possibly also substantially confined only to certain areas within the auxiliary layer), which, preferably by means of a certain "activation", "firing", or annealing step (e.g., by heat, or by irradiation with electromagnetic waves, etc), may act chemically and/or physically on the auxiliary layer, the thin layer of solid state material, or both. In one example, defects and impurities in a thin layer comprising silicon are passivated by diffusing hydrogen from the auxiliary layer (that comprises, e.g., a hydrogen-rich PECVD silicon nitride) into the thin layer.

In another example, metal electric contacts are created on the surface of the thin layer by locally firing an auxiliary layer comprising a metal paste, e.g., by irradiating selected areas of the auxiliary layer with a laser. In another example, metal electric contacts are created on the surface of the thin layer by ashing a polymer auxiliary layer comprising metal particles, with the metal particles locally melting on the surface of the thin layer into metal structures providing electric contact to the thin layer. The metal particles may be inhomogeneously arranged in the auxiliary layer according to the desired contact pattern, or they may be homogeneously distributed in the auxiliary layer and selectively melted only in the desired areas e.g. by irradiating with a laser. In another example, metal electric contacts inside the auxiliary layer itself and/or electrical connections between auxiliary layer and thin layer are created, e.g., using an auxiliary layer comprising a non-conductive material, such as a polymer, with embedded metal particles arranged as patterns of high and low concentrations of metal particles, leading to locally high and low electrical conductivity, respectively. In another example, electric contacts inside the auxiliary layer itself and/or electrical connections between auxiliary layer and thin layer are created using an auxiliary layer comprising a non-conductive material, such as a polymer, with embedded tunnels or (microfluidic) channels filled with an electrically conducting liquid such as a low-melting point metal or alloy (e.g., eutectic gallium-indium alloy). Such tunnels or channels can be created, e.g., by irradiating the auxiliary layer with a laser transmitted through the thin layer as described above.

In another example, surface structures on the thin layer are created by chemically reacting one or more materials in the auxiliary layer with the material of the thin layer at certain specific locations on the interface between auxiliary layer and thin layer. For example, irradiating selected areas of a photoactive auxiliary layer with, e.g., UV light, can locally create reactive species such as free radicals, acids, bases, etc that, at the interface between auxiliary layer and thin layer, locally react with the thin layer to form locally defined surface structures, for example, by locally etching or oxidizing the thin layer. In one example, such reactions are induced over the whole interface between auxiliary layer and thin layer in order to facilitate delamination and removal of the adhering auxiliary layer. In other examples, such locally definable chemical reactions at the interface between auxiliary layer and thin layer are used for producing, e.g., an antireflective or protective coating on the thin layer.

Embodiments of the present invention also relate to producing thin, free-standing layers of solid state materials with structured surfaces from mono- or polycrystalline semiconductor materials. The present invention may be deployed where thin mono- or polycrystalline silicon disks are needed or desirable (e.g., due to cost considerations), and where locally definable surface structures comprising also materials other than silicon are to be formed on at least one face of those thin disks. Advantageous applications include the production of cost-effective and efficient mono-crystalline silicon solar cells having surface structures that substantially act as electrical contacts, or structures for micro-electromechanical devices on thin, mechanically flexible substrates. For example, embodiments of the invention facilitate split-off, from a flat monocrystalline silicon slab, of layers having thicknesses of approximately 50 μm, and forming locally defined structures on the surface of these layers. On these thin silicon layers, for example, the invention facilitates creation of surface-structure features having lateral dimensions ranging from significantly below one millimeter up to several centimeters.

A major advantage of the invention lies in significant reduction of the number of processing steps required to produce thin, free-standing layers of solid state materials with surface structures. In contrast to traditional methods, the processes for cutting thin layers from a thicker piece of solid state material, and most of the subsequent processes for forming controllable surface structures on these layers (such as polishing, cleaning, mask deposition, mask patterning, mask transfer, mask removal) are all combined into a single, much simpler and significantly less expensive process sequence. Furthermore, the present approach significantly reduces the material loss that occurs during the production of thin, free-standing layers of solid state materials with surface structures. In contrast to previous methods that employ, e.g., sawing, grinding, polishing, or etching, the present approach incurs almost no loss of valuable feedstock material. When splitting off a thin layer from a work piece, the feedstock remains almost completely distributed between the split-off layer and the remainder of the work piece.

Another advantage of the invention is the ability to implement it using significantly less expensive equipment. Embodiments of the invention can be readily integrated into existing production methods, e.g., for the production of thin silicon solar cells with surface structures.

Finally, an advantage of the invention is that it can be applied to many different types of solid state materials.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method of printing comprising the steps of:
   providing a solid state material having an exposed surface;
   applying an auxiliary layer comprising a polymer to the exposed surface to form a composite structure;
   subjecting the composite structure to conditions inducing a stress pattern in the auxiliary layer and in the solid state material by setting up a pre-defined temperature distribution profile inside the auxiliary layer, with a glass transition temperature of the polymer being between minimum and maximum temperatures of the temperature distribution profile, such that a part of the auxiliary layer tempered to a temperature below the glass transition temperature of the polymer is stiffer than another part of the auxiliary layer tempered to a temperature above the glass transition temperature, thereby facilitating fracture of the solid state material substantially along a plane at a depth therein, wherein the glass transition temperature of the polymer is below room temperature; and
   removing the auxiliary layer and, therewith, a layer of the solid state material terminating at the fracture depth, an exposed surface of the removed layer of solid state material having a surface topology corresponding to the stress pattern.

2. The method of claim 1 wherein at least one material property of the auxiliary layer varies according to a pattern depending on position within the auxiliary layer.

3. The method of claim 2 wherein the auxiliary layer is a composite structure, or wherein the at least one material property of the auxiliary layer that varies according to a pattern affects magnitude and/or orientation of local stresses induced when the auxiliary layer is subjected to the stress inducing conditions, or wherein the at least one material property of the auxiliary layer that varies according to a pattern affects dynamics of crack propagation during the fracture of the solid state material, or wherein the at least one material property of the auxiliary layer that varies according to a pattern affects extent to which volume of material of the auxiliary layer changes when subjected to the stress inducing conditions, or wherein the at least one material property of the auxiliary layer that varies according to a pattern is coefficient of thermal expansion (CTE), or wherein the at least one material property of the auxiliary layer that varies according to a pattern affects extent to which material of the auxiliary layer swells when absorbing a solvent, or wherein the at least one material property of the auxiliary layer that varies according to a pattern is an elastic modulus, or wherein the at least one material property of the auxiliary layer that varies according to a pattern is local thickness of the auxiliary layer, or wherein the at least one material property of the auxiliary layer that varies according to a pattern is locally modified by at least one active device that is locally embedded in the auxiliary layer, or wherein the at least one material property of the auxiliary layer that varies according to a pattern also varies in time during execution of the method.

4. The method of claim 1 wherein the stress inducing conditions vary according to a pattern depending on position within the auxiliary layer.

5. The method of claim 4 wherein the stress inducing conditions that vary according to a pattern are different temperatures that are maintained at different positions within the auxiliary layer, or wherein the stress inducing conditions that vary according to a pattern are different chemical concentrations that are maintained at different positions within the auxiliary layer.

6. The method of claim 4 wherein the stress inducing conditions that vary according to a pattern affect at least one active device that is locally embedded in the auxiliary layer.

7. The method of claim 1 wherein the stress inducing conditions affect magnitude and/or orientation of local stresses induced when the auxiliary layer is subjected to the stress inducing conditions, or wherein the stress inducing conditions affect dynamics of crack propagation during the fracture of the solid state material, or wherein the stress inducing conditions effect changes of volume of material of the auxiliary layer.

8. The method of claim 1 wherein the stress inducing conditions are external mechanical forces that are applied onto the auxiliary layer, or wherein the stress inducing conditions affect an elastic modulus of the auxiliary layer, or wherein the stress inducing conditions comprise absorption of a solvent by at least part of the auxiliary layer.

9. The method of claim 1 wherein the stress inducing conditions vary in time during execution of the method and comprise at least one change in temperature imposed on the auxiliary layer, or cooling the auxiliary layer below room temperature.

10. The method of claim 1 wherein the fracture of the solid state material is induced at a depth in the solid state material and substantially along a plane that is substantially parallel to the interface between the auxiliary layer and the solid state material.

11. The method of claim 1 wherein the removing step reveals a new exposed surface of the solid state material having a surface topology complementary to the surface topology of the removed layer of solid state material.

12. The method of claim 11 further comprising the steps of:
applying a new auxiliary layer to the new exposed surface of the solid state material to form a new composite structure;
subjecting the new composite structure to conditions inducing a new stress pattern in the new auxiliary layer and in the solid state material, thereby facilitating fracture of the solid state material substantially along a plane at a new depth therein; and
removing the new auxiliary layer and, therewith a new layer of the solid state material terminating at the new fracture depth, an exposed surface of the new removed layer of solid state material having a surface topology corresponding to the new stress pattern.

13. The method of claim 1 wherein the exposed surface of the solid state material has a pre-existing surface topology comprising pre-existing microelectronic and/or micromechanical devices.

14. The method of claim 13 wherein the stress pattern is induced such that the effect that the pre-existing microelectronic and/or micromechanical devices have on the surface topology of the exposed surface of the removed layer is minimized.

15. The method of claim 1 further comprising the steps of:
applying a new auxiliary layer to the exposed surface of the removed layer of solid state material to form a new composite structure comprising the new auxiliary layer, the removed layer of solid state material and the previously applied auxiliary layer;
subjecting the new composite structure to conditions inducing a new stress pattern in the new auxiliary layer, in the solid state material and in the previously applied auxiliary layer, thereby facilitating fracture of the removed layer of solid state material substantially along a plane at a new depth therein; and
removing the new auxiliary layer and, therewith, a new layer of the solid state material terminating at the new fracture depth, an exposed surface of the new removed layer of solid state material having a surface topology corresponding to the new stress pattern.

16. The method of claim 15 wherein the auxiliary layer has a material property that varies according to a first pattern, and the new auxiliary layer has a material property that is the same as the material property of the auxiliary layer but that varies according to a second pattern different than the first pattern.

17. The method of claim 15 wherein the stress inducing conditions for each of the auxiliary layers vary according to a pattern, and the pattern for the auxiliary layer is different from the pattern for the new auxiliary layer.

18. The method of claim 1 wherein providing a solid state material comprises providing a structure comprising a semiconducting material.

19. The method of claim 1 wherein the auxiliary layer comprises a metal.

20. The method of claim 1 wherein the auxiliary layer comprises a composite structure comprising the polymer and a non-polymer and/or comprising structures of one or more inorganic materials embedded in a matrix comprising polydimethylsiloxane.

21. The method of claim 1 wherein the auxiliary layer has a coefficient of thermal expansion (CTE) that differs from a CTE of the provided solid state material by at least $10*10^{-6}$ $K^{-1}$.

22. The method of claim 1 wherein fracture of the solid state material is further facilitated by providing one or more zones with relatively lower fracture toughness in the solid state material before subjecting the composite structure to the conditions inducing the stress pattern, or while subjecting the composite structure to the conditions inducing the stress pattern.

23. The method of claim 1 wherein after removing the auxiliary layer and, therewith, a layer of the solid state material, the auxiliary layer is removed from the removed layer of solid state material.

24. The method of claim 1 wherein the surface topology of the removed layer of solid state material corresponds substantially to a topology of a surface for which vertical stress intensity factor KII is zero inside the composite structure.

25. The method of claim 1 wherein the exposed surface to which the auxiliary layer is applied has a curvature.

26. The method of claim 1 wherein the produced surface topology of the removed layer of solid state material is substantially mirror-symmetric, or comprises substantially periodic patterns with spatial periods smaller than 10 micrometers.

27. A method of printing comprising the steps of:
providing a solid state material having at least two exposed surfaces;
applying a plurality of auxiliary layers to a plurality of the at least two exposed surfaces, with one separate auxiliary layer for each of those exposed surfaces, to form a composite structure;
subjecting the composite structure to conditions inducing a stress pattern in the plurality of auxiliary layers and in the solid state material, thereby facilitating fracture of the solid state material, for each auxiliary layer, substantially along a plane at a depth in the solid state material; and
removing the plurality of auxiliary layers and, with each auxiliary layer, a layer of the solid state material terminating at the fracture depth, for each auxiliary layer, an exposed surface of the removed layer of solid state material having a surface topology corresponding to the stress pattern of that auxiliary layer where at least two of the fracture planes substantially coincide, and wherein the surface topology of the corresponding removed layers of solid state material substantially corresponds to superpositions of the stress patterns of the involved auxiliary layers.

28. A method of printing comprising the steps of:
providing a solid state material having first and second opposing and substantially parallel exposed surfaces;
applying first and second auxiliary layers to the first and second exposed surfaces, respectively, to form a composite structure;
subjecting the composite structure to conditions inducing a stress pattern in the two auxiliary layers and in the solid state material, thereby facilitating fracture of the solid state material substantially along a plane at a depth between the two opposing exposed surfaces; and
removing the two auxiliary layers and, removing with the first auxiliary layer, a first layer of the solid state material that terminates at the fracture depth, an exposed surface of the first removed layer of solid state material having a surface topology corresponding to a superposition of the stress pattern of the two auxiliary layers, and removing with the second auxiliary layer, a second layer of the solid state material that is the complement of the first removed layer of the solid state material with regard to the initially provided solid state material, an exposed surface of the second removed layer of solid state material having a surface topology complementary to the surface topology of the first removed layer of solid state material;

wherein the solid state material comprises a structure selected from the group consisting of a substrate, a wafer, a chip and a disk, and wherein the structure comprises pre-existing microelectronic and/or micromechanical devices.

* * * * *